(12) United States Patent
Baird et al.

(10) Patent No.: US 7,133,485 B1
(45) Date of Patent: Nov. 7, 2006

(54) FEEDBACK SYSTEM INCORPORATING SLOW DIGITAL SWITCHING FOR GLITCH-FREE STATE CHANGES

(75) Inventors: Rex T. Baird, Nashua, NH (US); Yunteng Huang, Austin, TX (US); Michael H. Perrott, Cambridge, MA (US)

(73) Assignee: Silicon Laboratories Inc., Austin, TX (US)

( * ) Notice: Subject to any disclaimer, the term of this patent is extended or adjusted under 35 U.S.C. 154(b) by 771 days.

(21) Appl. No.: 10/180,833

(22) Filed: Jun. 25, 2002

Related U.S. Application Data

(60) Provisional application No. 60/300,699, filed on Jun. 25, 2001.

(51) Int. Cl.
*H03D 3/24* (2006.01)
(52) U.S. Cl. .................................................... 375/376
(58) Field of Classification Search ................ 375/259, 375/285, 354, 371, 373, 376, 377; 370/395.5, 370/395.1, 389, 351; 455/7, 24, 39, 68, 69
See application file for complete search history.

(56) References Cited

U.S. PATENT DOCUMENTS

| | | | |
|---|---|---|---|
| 5,012,244 A | 4/1991 | Wellard et al. |
| 5,036,294 A | 7/1991 | McCaslin |
| 5,036,300 A | 7/1991 | Nicolai |
| 5,200,750 A | 4/1993 | Fushiki et al. |
| 5,754,072 A | 5/1998 | Mazzetti |
| 6,137,372 A | 10/2000 | Welland |
| 6,147,567 A | 11/2000 | Welland |
| 6,344,814 B1 | 2/2002 | Lin et al. |
| 6,385,443 B1 | 5/2002 | Lee et al. |
| 6,400,298 B1 | 6/2002 | Lee |
| 6,515,540 B1 | 2/2003 | Prasad et al. |
| RE38,083 E | 4/2003 | Ashe |
| 6,556,159 B1 | 4/2003 | Fei et al. |
| 6,566,966 B1 | 5/2003 | Bellaouar et al. |
| 6,580,376 B1 | 6/2003 | Perrott |
| 6,590,426 B1 | 7/2003 | Perrott |
| 6,646,581 B1 | 11/2003 | Huang |
| 6,750,839 B1 | 6/2004 | Hogan |
| 2002/0008593 A1 | 1/2002 | Gomez et al. |
| 2002/0135428 A1 | 9/2002 | Gomez |
| 2003/0016088 A1 | 1/2003 | Scheffler |

*Primary Examiner*—Pankaj Kumar
(74) *Attorney, Agent, or Firm*—Zagorin O'Brien Graham LLP

(57) ABSTRACT

A feedback system such as a phase locked loop (PLL) includes a second feedback loop which responds when a VCO control voltage is near either end of its range, by slowly adjusting additional tuning elements which control the VCO frequency. The second feedback loop is arranged to cause a slow enough change in the VCO frequency that the first traditional feedback loop adjusts the control voltage quickly enough in a direction toward its mid-range value to keep the VCO frequency substantially unchanged. The second feedback loop advantageously incorporates one or more digital control signals which preferably change no more than one bit at a time and with a controlled slow ramp rate. As a result, the PLL maintains phase accuracy so that the operation of the PLL, including subtle specifications such as input data jitter tolerance or output jitter generation when used for clock and data recovery applications, is not negatively impacted. An impedance tuning feedback system provides a resistance between two nodes which is proportional to a reference resistance, and preferably incorporates slow digital switching to result in near perturbation-free state changes over the tuning range of the resistance.

49 Claims, 21 Drawing Sheets

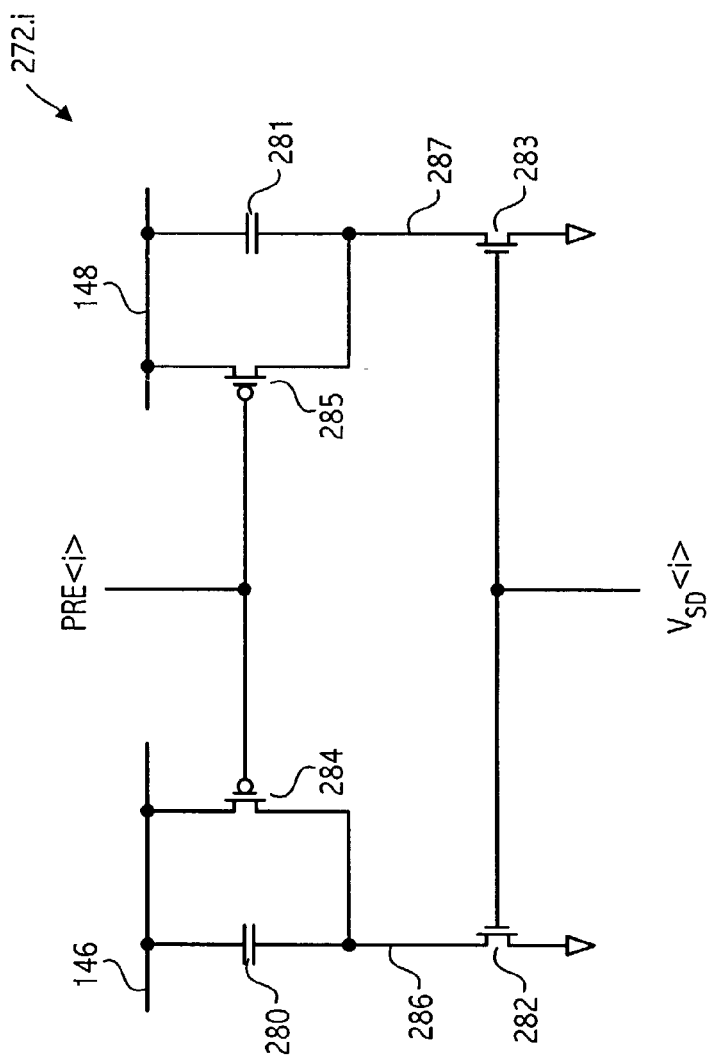
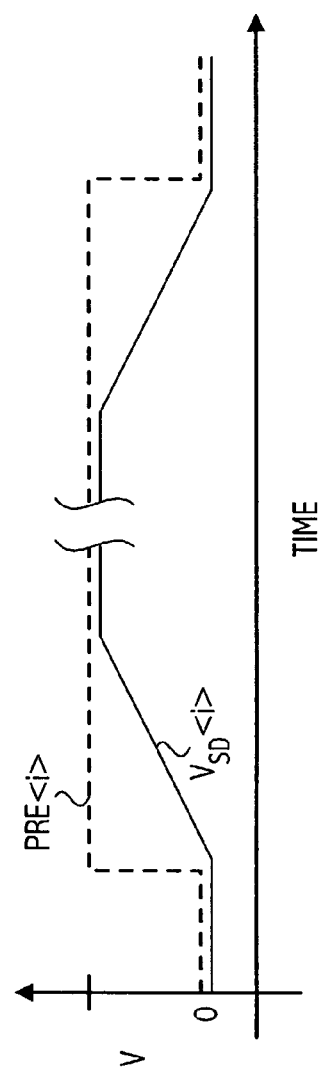
FIG. 12
FIG. 13

FEEDBACK SYSTEM INCORPORATING SLOW DIGITAL SWITCHING FOR GLITCH-FREE STATE CHANGES

CROSS-REFERENCE TO RELATED APPLICATION(S)

This application is entitled to the benefit of U.S. Provisional Application No. 60/300,699 by Baird, et al. filed Jun. 25, 2001, the disclosure of which is incorporated herein by reference.

This application is related to co-pending U.S. patent application Ser. No. 10/180,783 by Baird, entitled "Inpedance Tuning Circuit", filed on even day herewith.

BACKGROUND OF THE INVENTION

The present invention relates to feedback control systems, and particularly to those feedback systems utilizing phase-locked loops.

Feedback systems are well known in the art and are found in a multitude of different configurations. One such well-known configuration is a phase locked loop (PLL). A generalized block diagram is shown in FIG. 1 of a traditional PLL configured for a clock and data recovery application. Such a configuration may be used for recovering clock and data streams compatible with the SONET specification, as well as others. The phase locked loop 100 includes a phase detector 102 (or alternatively, a phase/frequency detector) which receives the input data signal conveyed on node 112 and receives a data clock signal conveyed on node 122. The phase detector 102 generates on its output node 116 an error signal which is a function of the phase difference (and frequency difference in the case of a phase/frequency detector) between the input data signal and the data clock signal, and often includes data retiming circuitry to generate on an output node 114 the reconstructed data, as shown.

A loop filter 104 filters the output of the phase detector 102 to generate a control voltage signal on node 118 which is provided to a voltage controlled oscillator 110 in order to influence the frequency (and hence the phase) of the VCO output clock signal conveyed on node 120. The loop filter 104 frequently includes an integrator block which is implemented using a charge pump and a loop filter capacitor. The VCO output clock signal may be divided-down by divider 106 to generate the data clock signal (conveyed on node 122) based upon the expected data rate of the incoming data signal.

If such a PLL were implemented using discrete components, precision components could be used to provide a nominal VCO frequency relatively close to a desired center frequency. However, such a discrete implementation is costly and requires a large amount of printed wiring board space, and more than likely would have difficulty achieving the performance required of modern systems while operating at an acceptable power level. Consequently, most VCOs are implemented monolithicly (i.e., on a single integrated circuit die). As is well known in the art, the absolute value of certain parameters on an integrated circuit may vary greatly due to process variations (e.g., lot-to-lot variations, wafer-to-wafer variations within a lot, die-to-die variations within a wafer) and as environmental variables change (e.g., die temperature, power supply voltage variations, etc.). Even though the tracking of certain parameters within a single integrated circuit is frequently quite good (which is the basis of many advantageous circuit techniques), the nominal frequency of many VCO circuits can vary greatly from die to die. While the frequency of the VCO can inherently be adjusted by an appropriate control voltage, the subsequent adjustability of the VCO may be reduced if the control voltage otherwise necessary to achieve the initially-desired VCO frequency falls too close to either the upper extreme or the lower extreme of its range. Said differently, such a PLL 100 may perform more optimally over time when the control voltage for the VCO is nominally somewhat centered within its expected voltage range.

One possible technique increases the gain of the VCO so that large changes in VCO frequency may be achieved by changes in the control voltage well within the expected range of control voltages. In principle this would allow a PLL to compensate for a large deviation in VCO "center frequency" without requiring a control voltage dangerously close to "running out of range." But there are detrimental consequences of increasing the VCO gain, including danger of locking onto a harmonic, and increased noise and jitter of the system. Moreover, with most VCO circuit structures it is difficult to arbitrarily provide an ever higher and higher tuning range and still achieve good frequency and phase stability.

One approach to accommodating the VCO center frequency variations involves trimming the frequency using, for example, a precision laser. After the semiconductor fabrication steps are complete, and either during wafer-level testing or possibly after singulization of individual circuit dies, the VCO is tested to determine its center frequency, and various circuit elements (e.g., resistors, capacitors) are trimmed to adjust the center frequency to the desired value. The remaining testing and packaging operations are then performed to complete the manufacturing of the circuits. Alternatively, such trimming may also be accomplished using a flash memory programming technique coupled with appropriate selection circuits, although this requires a semiconductor process capable of forming compatible flash memory elements. In either case, such trimming is a "permanent" adjustment of the center frequency during manufacture, but it adds costly manufacturing steps to either accomplish laser trimming after wafer fabrication or to provide a semiconductor process capable of implementing flash memory structures or other kinds of programmable structures. Moreover, such trimming is performed once during manufacture, and cannot adjust for subsequent changes in environmental conditions that the circuit may be called upon to operate under.

Another approach to accommodating the VCO center frequency variations involves calibrating the VCO center frequency each time the circuit is powered-up. Such techniques may involve comparing the center frequency against an externally provided reference frequency signal and setting a number of storage elements (e.g., registers) to appropriately adjust the center frequency. Such storage elements are volatile and lose stored data when the circuit loses power. An example of a device that performs such a calibration upon power-up is the Si4133G RF Synthesizer, which is available from Silicon Laboratories, Inc. based in Austin, Tex.

These approaches are valuable additions to the state of the art, but they cannot accommodate variations in the center frequency as environmental conditions change, as semiconductor parameters drift over time (e.g., threshold voltage shifts), or as other artifacts of component aging occur. This becomes increasingly more important in certain industrial systems which are put into operation and virtually never shut down. Examples include various interface circuits within the telecommunications infrastructure, which may operate for years without an opportunity to recalibrate during a subsequent power-up operation.

What is needed is an effective way to accommodate environmental or parametric changes in a feedback system which occur after the system is powered up and while operational, without negatively impacting the operation of the feedback system within its intended specifications.

SUMMARY OF THE INVENTION

Such a capability may be accomplished in a clock and data recovery circuit, such as PLL 100, by introducing a second feedback loop which reacts to the control voltage reaching a level sufficiently different from its mid-range value by slowly adjusting additional tuning elements which, along with the tuning elements controlled by the control voltage signal, control the VCO frequency. Absent the first traditional feedback loop, a change in the VCO frequency would result, but the second feedback loop is arranged to cause a slow enough change in the VCO frequency that the first feedback loop is able to compensate for the would-be change by adjusting the control voltage quickly enough in a direction toward the mid-range value to keep the VCO frequency substantially unchanged. The second feedback loop may advantageously incorporate one or more digital control signals to affect a tuning change by changing from one state to another state. These digital signals preferably change no more than one bit at a time, and the single bit which changes is preferably caused to achieve a controlled transition time (or ramp rate) which is slow enough to cause a very gradual change in the value of the associated tuning elements. As a result, the PLL maintains lock during and after the digital signal changes state, and more importantly, maintains its phase accuracy so that the operation of the PLL, including subtle specifications such as input data jitter tolerance and jitter generation are not negatively impacted.

In a broader context of the present invention, such a capability may be accomplished in an electronic feedback system having a first feedback loop responsive to a control signal for controlling a parameter of the feedback system, by providing a second feedback loop for generating at least one digital control signal to influence the feedback system in a manner which, absent the first feedback loop, would result in a change to the controlled parameter when the digital control signal changes value. The digital control signals are arranged to influence the feedback system slowly enough, relative to the first feedback loop, to allow the first feedback loop to adjust the control signal and maintain the controlled parameter substantially unchanged as the digital control signal changes value.

BRIEF DESCRIPTION OF THE DRAWINGS

The present invention may be better understood, and its numerous objects, features, and advantages made apparent to those skilled in the art by referencing the accompanying drawings.

FIG. 12 is a schematic diagram of a circuit useful for the circuit shown in FIG. 11.

FIG. 13 is a waveform diagram of various signals of the circuit of FIG. 12.

DESCRIPTION OF THE PREFERRED EMBODIMENT(S)

Figure 1:
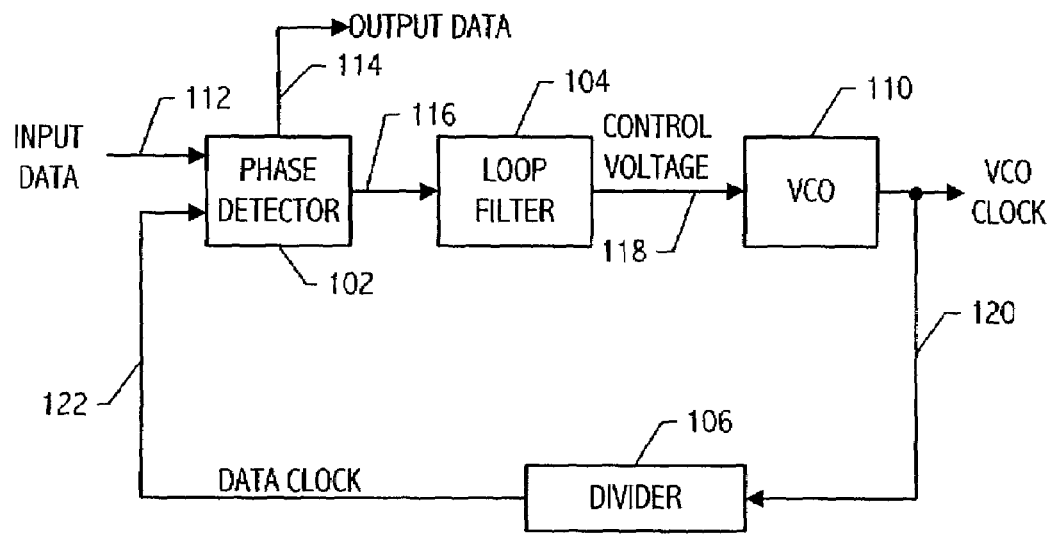
FIG. 1, labeled prior art, is a block diagram of a traditional phase locked loop feedback system arranged to recover clock and data from an incoming serial data signal.
Figure 2:
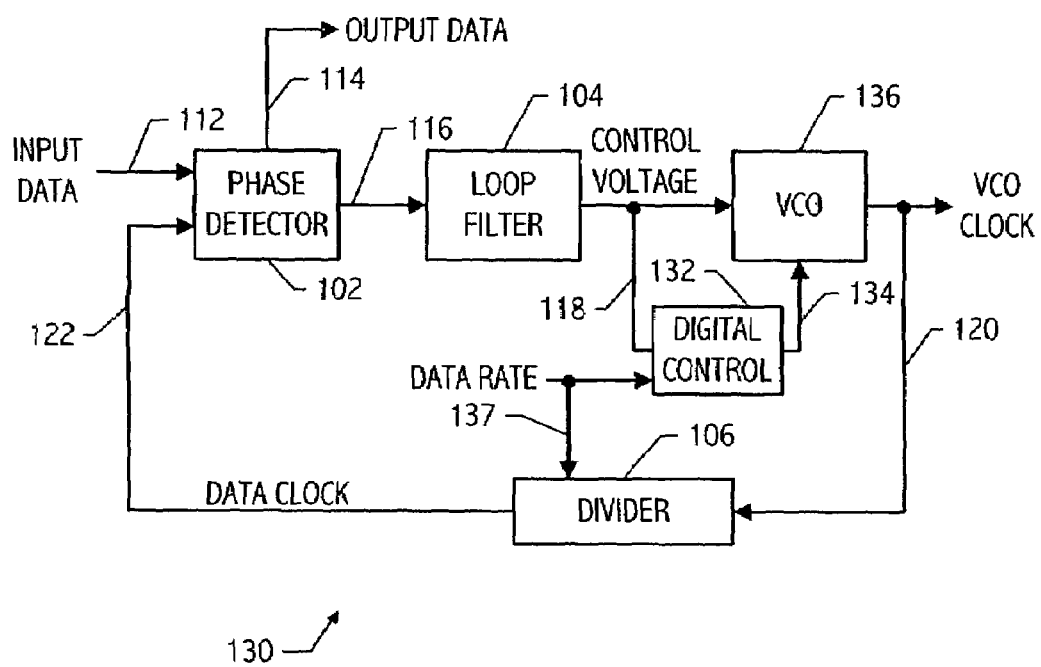
FIG. 2 is a block diagram of a clock and data recovery phase locked loop feedback system in accordance with the invention.

Referring now to FIG. 2, a generalized block diagram is shown of an exemplary PLL 130 configured for a clock and data recovery application which is similar in many respects to the earlier described PLL 100, but which incorporates a second feedback loop to better accommodate gradual environmental or parametric changes in the PLL. The phase locked loop 130 includes a phase detector 102 which generates on its output node 116 an error signal which is a function of the phase difference between the input data signal and the data clock signal, and which includes data retiming circuitry to generate on an output node 114 the reconstructed data, as shown. Unless the context so requires, as used herein a "phase detector" may also refer to a phase/frequency detector. A loop filter 104 filters the output of the phase detector 102 to generate a control voltage signal on node 118. A VCO 136 is provided which includes two separate control inputs (nodes 118 and 134), and which generates on its output node 120 a VCO clock signal. If the PLL 130 is configurable for operation at more than one data rate, the VCO output clock signal is preferably divided-down by divider 106 (based upon the expected data rate of the incoming data signal as communicated by a data rate signal conveyed on node 137) to generate the data clock signal conveyed on node 122. Advantageous circuits for the phase detector 102 and for the loop filter 104 are described in U.S. Provisional Application No. 60/217,208 entitled "Digitally-Synthesized Loop Filter Capacitor," filed Jul. 10, 2000, which application is incorporated herein by reference in its entirety, and in U.S. patent application Ser. No. 09/902,542 entitled "Digital Phase Detector Circuit and Method Therefor," filed Jul. 10, 2001, which application is incorporated herein by reference in its entirety, and in U.S. patent application Ser. No. 09/902,541 entitled "Digitally-Synthesized Loop Filter Circuit Particularly Useful for a Phase Locked Loop," filed Jul. 10, 2001, which application is incorporated herein by reference in its entirety.

The control voltage signal conveyed on node 118 is coupled to the first control input of the voltage controlled oscillator 136 in order to influence the frequency (and hence the phase) of the VCO output clock signal. The control voltage signal is also conveyed to a digital control block 132 which generates a control signal on node 134 which is coupled to the second control input of the voltage controlled oscillator 136. Both control inputs influence the frequency (and hence the phase) of the VCO output clock signal, as is described in greater detail herebelow.

Figure 3A:
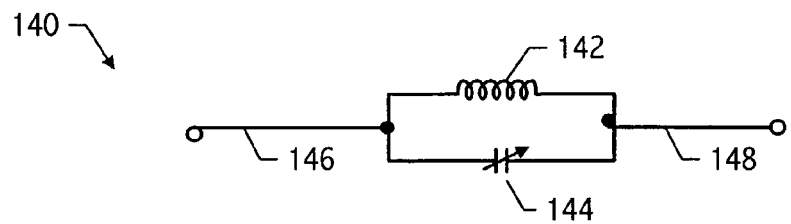
FIGS. 3A and 3B are schematic diagrams of an LC tank circuit useful for the present invention.
Figure 3B:
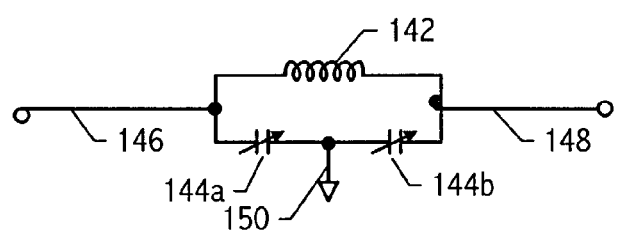

To better describe the operation of various exemplary embodiments of the present invention, a brief digression is warranted. Referring now to FIG. 3A, a resonant LC tank circuit 140 is shown having a variable capacitor 144 connected in parallel with a fixed inductor 142 and together coupled between nodes 146 and 148. Such a resonant circuit is particularly useful in many VCO circuits which use differential circuitry, and may be connected between a pair of differential nodes of the VCO such as, for example, differential nodes of a gain block. As a balanced differential circuit, a virtual ground may be visualized "in the middle" of the variable capacitor 144. As shown in FIG. 3B, the single variable capacitor 144 may be replaced with a pair of variable capacitors 144a and 144b respectively connecting nodes 146 and 148 to a common ground node 150.

Figure 4A:
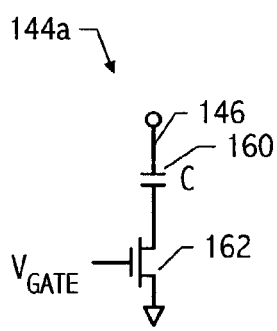
FIGS. 4A, 4B, and 4C are schematic diagrams of a variable capacitance circuit and its modeling.
Figure 4B:
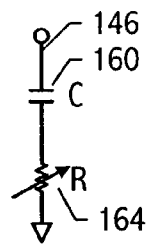
Figure 4C:
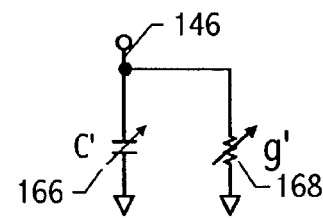

Compared to a variable capacitor literally connecting two circuit nodes together, a variable capacitor connecting a circuit node to ground is much easier to implement. One implementation of variable capacitor 144a is shown in FIG. 4A, which includes a fixed capacitor 160 connected in series with an N-channel switch transistor 162 whose source terminal is connected to ground. A variable gate voltage $V_{GATE}$ is applied to the gate terminal of transistor 162 to control the conductivity of the transistor 162. The range of gate voltages as well as the particular transistor threshold voltage may both be chosen to provide a switch transistor that is fully turned off at one extreme of the gate voltage range, and substantially turned on (i.e., conductive) at the other extreme of the gate voltage range. The transistor 162, in effect, functions as a variable resistor (as well as a switch). Consequently, the implementation of variable capacitor 144a may be modeled, as depicted in FIG. 4B, as a variable resistance 164 in series with the fixed capacitor 160. For a narrow frequency band around the VCO oscillation frequency, this series circuit in turn may be modeled by an equivalent parallel circuit, as shown in FIG. 4C. This parallel circuit includes a corresponding variable capacitor 166 connected in parallel with a variable conductance 168, both connected between node 146 and ground.

The magnitude of both the variable capacitor 166 and the variable conductance 168 vary as a function of the gate voltage $V_{GATE}$ applied to transistor 162. The magnitude of the variable capacitance 166 (indicated as C') as a function of the gate voltage $V_{GATE}$ applied to transistor 162 is plotted in FIG. 4D. When the gate voltage $V_{GATE}$ is low, the resistance of transistor 162 is high (assuming an N-channel transistor), and not much current flows through the transistor 162. Consequently the capacitance C' is very low because the circuit 144a is virtually an open circuit. When the gate voltage $V_{GATE}$ is high, the resistance of the transistor 162 is low, and the capacitor 160 lower terminal is held robustly to ground. Consequently, the capacitance C' is virtually identical to the magnitude of the capacitor 160 because the circuit 144a is essentially a capacitor connected between node 146 and ground.

Figure 4D:
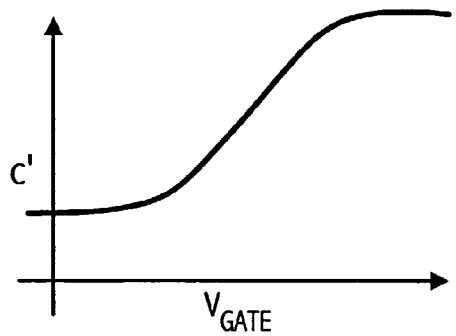
FIGS. 4D and 4E are graphs showing characteristics of the modeled circuit element shown in FIG. 4C.
Figure 4E:
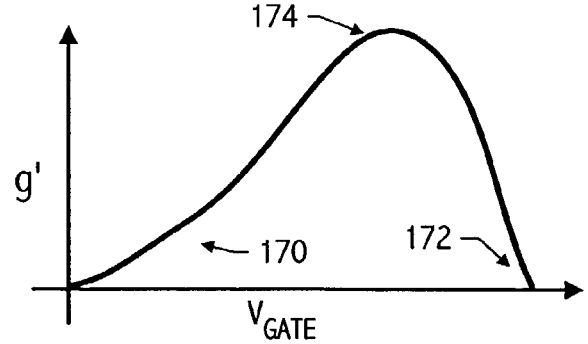

The magnitude of the variable conductance 168 (indicated as g') as a function of the gate voltage $V_{GATE}$ applied to transistor 162 is plotted in FIG. 4E. When the gate voltage $V_{GATE}$ is low, the resistance of transistor 162, modeled as the variable resistor 164, is high (again assuming an N-channel transistor), and not much current flows through the transistor 162. Consequently the conductance g' is very low (see, for example, region 170) because the transistor 162 is almost off and the circuit 144a is virtually an open circuit. When the gate voltage $V_{GATE}$ is high, the resistance of the transistor 162 is low, and the capacitor 160 terminal is held robustly to ground. Consequently, the conductance g' is very low in this case as well (see, for example, region 172) because the circuit 144a is essentially a capacitor connected between node 146 and ground. However, at intermediate gate voltages, both the resistor and the capacitor interact and the conductance g' exhibits a peak (region 174). As long as the VCO circuit (or other circuit to which connected) has enough gain to support the necessary current flow through this conductance, the variable capacitor 144a circuit may be effectively used to provide a variable amount of capacitance that is controlled by an analog gate voltage $V_{GATE}$, as shown in FIG. 4D.

Figure 5:
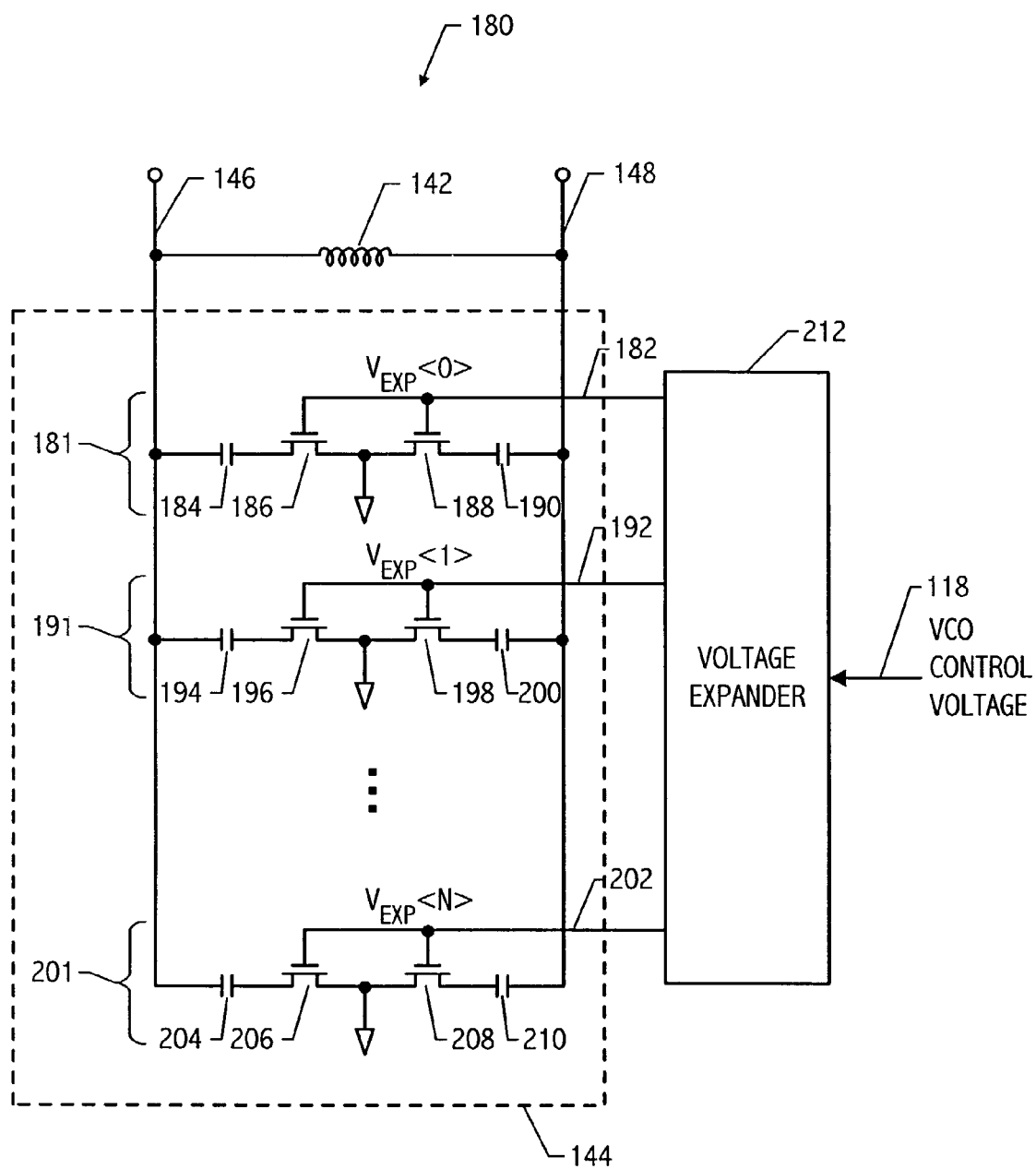
FIG. 5 is a schematic diagram of an LC tank circuit which shows a variable capacitance circuit useful for the present invention which receives a plurality of expanded voltage signals.

While a single variable capacitor circuit as shown in FIG. 4A indeed functions as a variable capacitor (i.e., a "varactor"), the performance of such a circuit is affected by certain semiconductor parameters, such as transistor threshold voltage and transistor mobility. Such variations in performance may be reduced, and greater precision and overall linearity of the variable capacitor may be achieved, by using a large group of such circuits connected in parallel, each having a separate capacitor and each controlled by a separate gate voltage control signal. A differential LC tank circuit 180 is shown in FIG. 5 as one possible implementation of the circuit 140 shown earlier in FIG. 3A. As before, an inductor 142 is connected between nodes 146 and 148. Such an inductor may be implemented monolithicly as a spiral inductor, or preferably as a symmetrical series-connected pair of spiral inductors, or even provided off-chip. A variable capacitor 144 (as shown earlier in FIG. 3A) for the tank circuit is implemented by a group of identical variable capacitance circuits 181, 191, 201 in parallel, although it is understood that in actual practice many more than three such circuits are preferably implemented. One such circuit 181 includes a capacitor 184 whose first terminal is coupled to node 146 and whose second terminal is coupled to ground by transistor 186. Circuit 181 also includes a second capacitor 190 whose first terminal is coupled to node 148 and whose second terminal is coupled to ground by transistor 188. The respective gate terminal of transistors 186, 188 are both coupled to receive a gate control signal $V_{EXP}$<0> conveyed on node 182.

Similarly, variable capacitance circuit 191 includes two capacitors 194, 200 having a respective terminal thereof coupled to ground by respective transistors 196, 198 when a gate control signal $V_{EXP}$<1> conveyed on node 192 is at a suitable voltage (e.g., greater than the transistor threshold voltage), and variable capacitance circuit 201 includes two capacitors 204, 210 having a respective terminal thereof coupled to ground by respective transistors 206, 208 when a gate control signal $V_{EXP}$<N> conveyed on node 202 is likewise at a suitable voltage.

For this variable capacitance circuit 144, the various gate control signals are provided by a voltage expander 212, which receives the VCO control voltage 118 and generates a plurality of expanded VCO control voltages $V_{EXP}$<0>, $V_{EXP}$<1>, . . . $V_{EXP}$<N> corresponding to the VCO control voltage 118. For example, the expanded VCO control voltages may follow the following relationship:

$$V_{EXP}<i> = V_{IN} + (i)(V_{OFFSET}) + V_{BIAS}$$

As this relationship suggests, the $V_{OFFSET}$ and $V_{BIAS}$ values may be chosen to provide a plurality of substantially evenly-spaced output voltage levels that are related to the input voltage $V_{IN}$ (i.e., the VCO control voltage 118). The $V_{OFFSET}$ and $V_{BIAS}$ values may be chosen so that any number of the plurality of substantially evenly-spaced output voltage levels may be greater in voltage than the input voltage $V_{IN}$, with others of the plurality of output voltage levels that are lower in voltage than the input voltage $V_{IN}$. For example, all of the output voltage levels $V_{EXP}$<i> may be chosen to be greater in voltage than the input voltage $V_{IN}$. The input voltage $V_{IN}$ need not be replicated on one of the plurality of output voltage levels. However, as the voltage expander name somewhat implies (but does not necessarily so require), the $V_{OFFSET}$ and $V_{BIAS}$ values are preferably chosen to provide a plurality of substantially evenly-spaced output voltage levels $V_{EXP}$<i> that are nominally centered about the input voltage $V_{IN}$.

As a specific example, the voltage expander 212 may be configured to generate nine separate output voltages each 100 mV apart and centered as a group around the input voltage. Assuming that $V_{EXP}$<0> is the highest voltage and that $V_{EXP}$<8> is the lowest voltage, the fifth output voltage $V_{EXP}$<4> is then substantially equal to the input voltage (i.e., the VCO control voltage 118). If, for example, the VCO control voltage 118 at a particular time is equal to 1.8 volts, then the $V_{EXP}$<i> signals are generated respectively to be 1.4 volts, 1.5 volts, 1.6 volts, 1.7 volts, 1.8 volts, 1.9 volts, 2.0 volts, 2.1 volts, and 2.2 volts. As the VCO control voltage 118 increases or decreases, each of the $V_{EXP}$<i> output signals increases or decreases in the same direction and by substantially the same amount.

Figure 6:
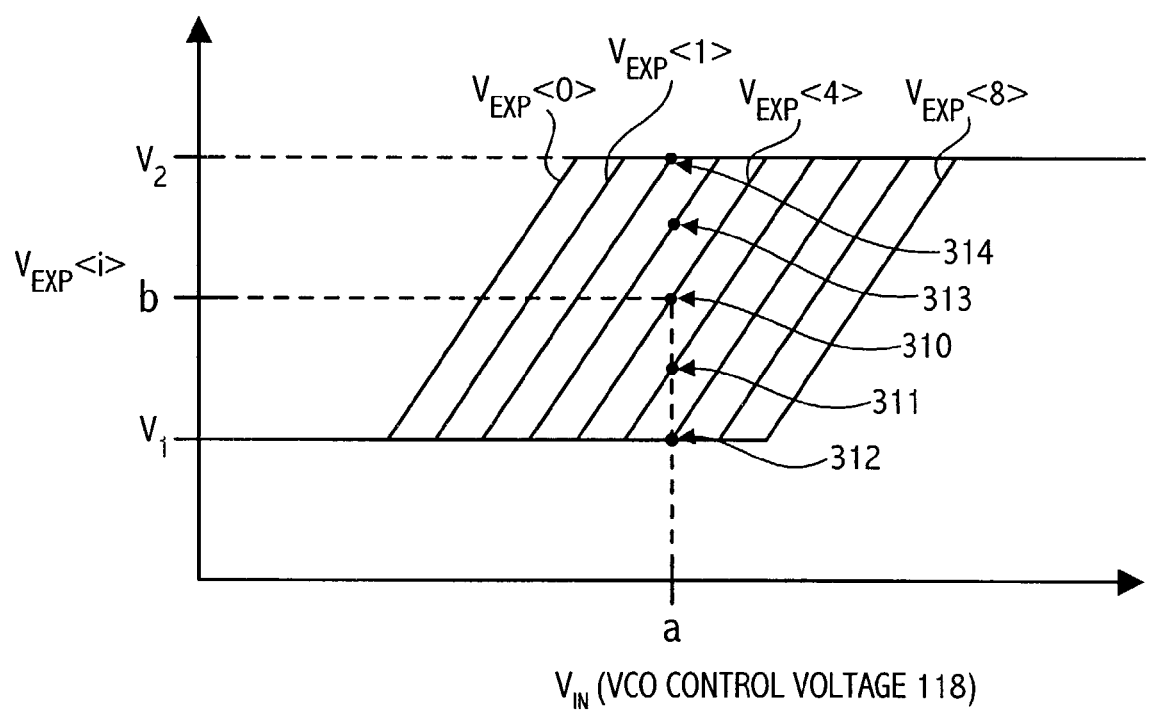
FIG. 6 is a waveform diagram of exemplary expanded voltage signals useful for the circuit shown in FIG. 5.

The linear behavior of each $V_{EXP}$<i> signal may be intentionally or unintentionally limited to an upper and lower bound, as shown in FIG. 6. Each of the exemplary waveforms $V_{EXP}$<0>, $V_{EXP}$<1>, . . . $V_{EXP}$<8> is plotted as a function of the input voltage (in this example, the VCO control voltage 118). Each $V_{EXP}$<i> output signal linearly tracks the input voltage with a corresponding offset voltage. However, the maximum voltage of each $V_{EXP}$<i> signal is limited to $V_2$ volts, and the minimum voltage of each $V_{EXP}$<i> signal is limited to $V_1$ volts. Such voltage limits may arise from the output range of the voltage expander 212 circuitry and, for example, may be substantially equal to the power supply voltages used in the design of the voltage expander 212 (i.e., VDD and ground). Alternatively, one or more of the voltage limits may be arbitrarily chosen to be a non-power supply value. In an exemplary circuit shown, the voltage limits arise from the head room of the design, and thus the value of $V_2$ is preferably just below VDD, while the value of $V_1$ is just above ground. In the variable capacitance circuit 144, the lower limit should preferably be chosen to be lower than the transistor threshold value of the switch transistors such as transistors 186 and 188 (assuming, as shown, N-channel transistors), while the upper limit should preferably be chosen to be higher than the threshold value of the switch transistors by an amount sufficient to substantially turn on the transistors.

Additional details of voltage expanders as used with a plurality of individual variable capacitance circuits in an LC tank circuit for a VCO are described in U.S. Pat. No. 6,137,372 to Welland, which is incorporated herein by reference in its entirety. In particular, the achievement of a greater linear range of capacitance as a function of input control voltage is described in detail therein. Preferred embodiments are described herebelow in the context of an exemplary clock and data recovery application.

Figure 7:
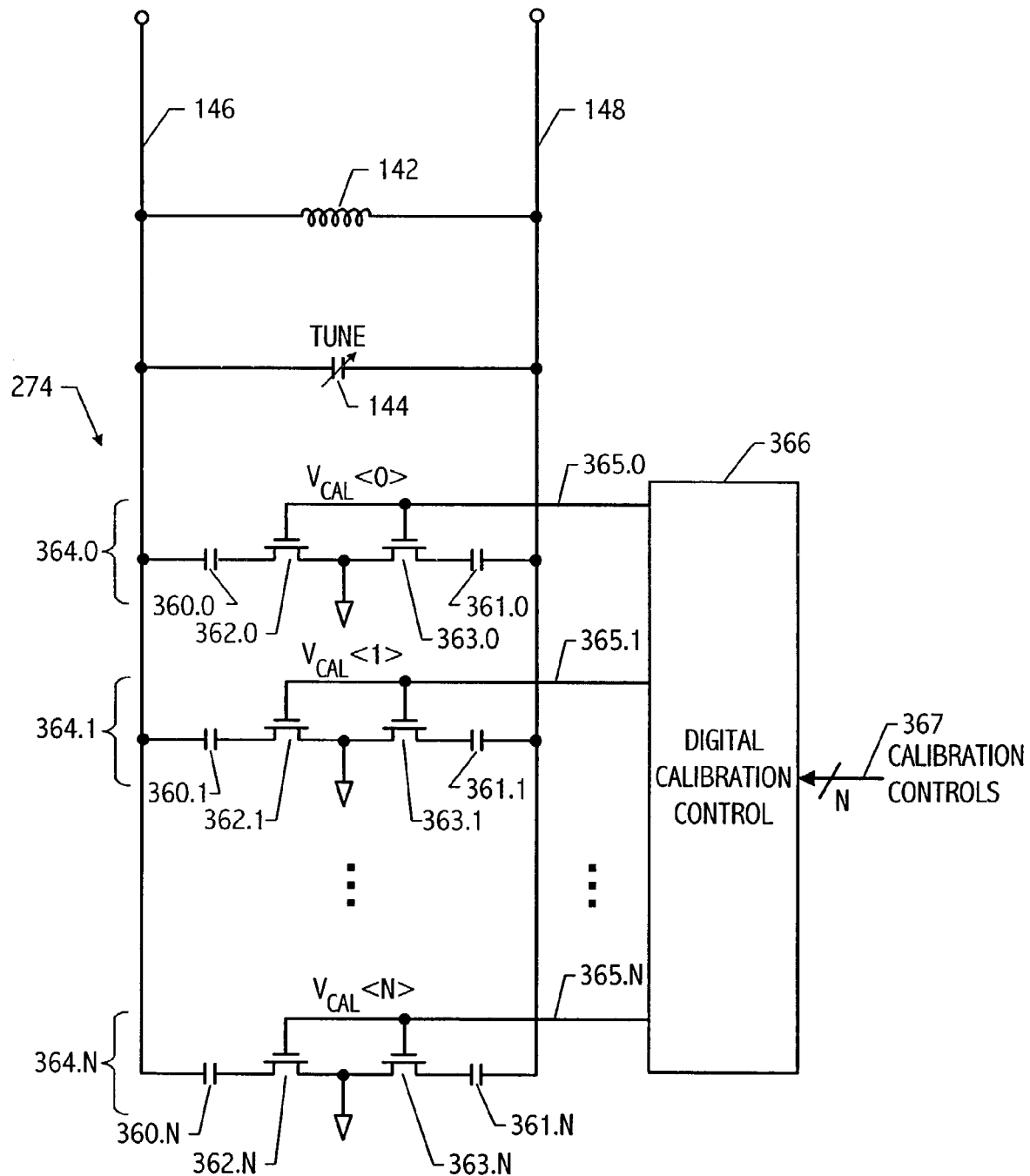
FIG. 7 is a schematic diagram of a tank circuit including a variable capacitance circuit useful for DC calibration of the oscillation frequency of the tank circuit.

The tuning range of such a continuously variable capacitance circuit 144 may be improved by including between nodes 146 and 148 an additional variable capacitance circuit that is adjusted during a calibration routine and generally held staticly thereafter. Referring now to FIG. 7, an exemplary embodiment of an improved tank circuit which includes a second variable capacitance circuit 274 is shown. This circuit is similar to the earlier described variable capacitance circuit 144 except that the various gate control voltages (i.e., in this case, the $V_{CAL}$<I> voltages) are preferably determined during a power-up calibration routine. Once determined, these gate control voltages $V_{CAL}$<i> (i.e., gate control signals) are preferably held staticly for as long as the device is powered, or until the range of the variable capacitance circuit 144 in FIG. 5 is exhausted. In such a case the variable capacitance circuit 144 is preferably centered in its dynamic range and a recalibration performed to determine new values for the gate control voltages $V_{CAL}$<i>.

For clarity, the variable capacitance circuit 274 includes a plurality of individual variable capacitance circuits 364.0, 364.1, . . . 364.N (also referred to as "sub-varactors"), each of which receives a respective one of a corresponding plurality of calibration gate control signals $V_{CAL}$<0>, $V_{CAL}$<1>, . . . $V_{CAL}$<N> from a digital calibration control block 366. Preferably twenty-one (21) such individual variable capacitance circuits are included, although other numbers may be advantageous depending upon the application. As before, each individual variable capacitance circuit 364.i includes a pair of balanced capacitors, each of which is "grounded" through a respective one of a corresponding pair of transistors, both of which transistors being responsive to a common gate control signal. Specifically, each variable capacitance circuit 364.i includes a capacitor 360.i having a first terminal connected to node 146 and having a second terminal coupled to ground through a transistor 362.i controlled by a corresponding calibration gate control signal $V_{CAL}$<i>, and further includes a capacitor 361.i having a first terminal connected to node 148 and having a second terminal coupled to ground through a transistor 363.$i$ also controlled by the corresponding calibration gate control signal $V_{CAL}$<i>.

Each of the calibration gate control signals $V_{CAL}$<i> are generated by a digital calibration control block 366 which determines, preferably at least during a power-up calibration routine, which signals to drive high and which to drive low. Once appropriately driven, the various $V_{CAL}$<i> signals preferably remain unchanged for as long as the device remains powered, or alternately until the dynamic tuning range is exceeded. The various $V_{CAL}$<i> calibration gate control signals are usually only changed during an initial calibration, and particularly not while the phase locked loop 130 remains operational and within specification. Consequently, each $V_{CAL}$<i> signal may be driven between full logic levels with little regard to ramp rate or transition time, and more than one such $V_{CAL}$<i> signal may be driven (i.e., and change logic states) at the same time.

The digital calibration control block 366 receives various calibration control signals conveyed on node(s) 367 to increment or decrement the total number of $V_{CAL}$<i> signals that are driven high, and thus increment or decrement the total effective capacitance "between" nodes 146 and 148. Such circuitry depends upon the particular calibration scheme employed by the device, is non-critical in performance, and its design is well within the capabilities of one skilled in the art.

Figure 8:
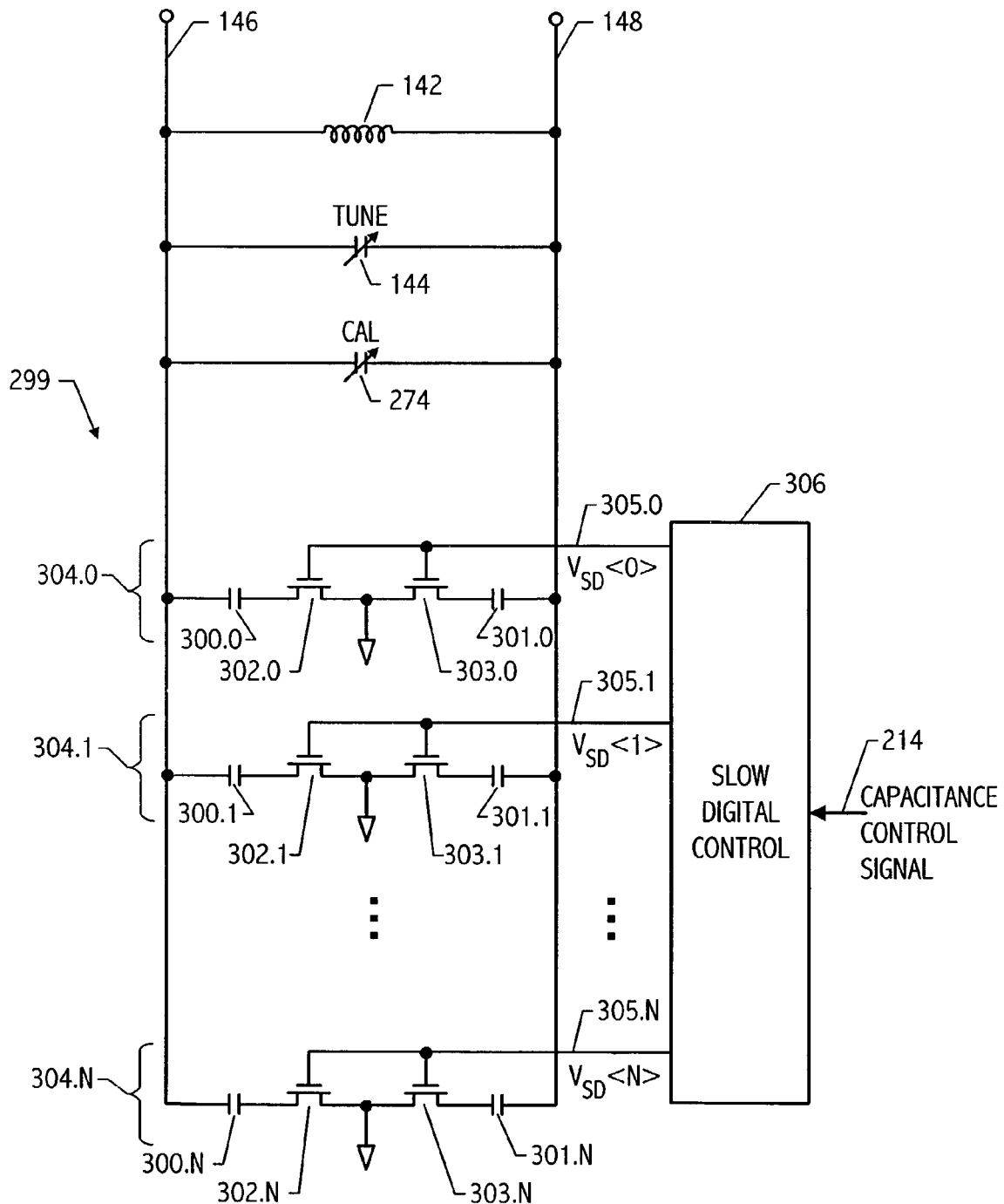
FIG. 8 is a schematic diagram of a tank circuit including a variable capacitance circuit useful for gradual adjustment of the oscillation frequency of the tank circuit, in accordance with an embodiment of the present invention.

Referring now to FIG. 8, the dynamic tuning range of the LC tank circuit may be increased by including yet another group of variable capacitance circuits 299 whose gates are generally held statically during operation, but which may be slowly switched on or off to gradually vary the amount of capacitance on nodes 146 and 148. Like the above described variable capacitance circuit 274, a plurality of individual variable capacitance circuits 304.0, 304.1, . . . 304.N are provided, each connected between nodes 146 and 148, and each of which receives a respective one of a corresponding plurality of slow digital gate control signals $V_{SD}$<0>, $V_{SD}$<1>, . . . $V_{SD}$<N> conveyed respectively on nodes 305.0, 305.1, . . . 305.N. The variable capacitance circuit 299 preferably includes thirty-six (36) such individual variable capacitance circuits 304.$i$, although other choices may be advantageous depending upon the application. As before, each variable capacitance circuit 304.$i$ includes a capacitor 300.$i$ having a first terminal connected to node 146 and having a second terminal coupled to ground through a transistor 302.$i$ controlled by a corresponding gate control signal $V_{SD}$<i>, and further includes a capacitor 301.$i$ having a first terminal connected to node 148 and having a second terminal coupled to ground through a transistor 303.$i$ also controlled by the corresponding slow digital gate control signal $V_{SD}$<i>.

A slow digital control block 306 receives a capacitance control signal conveyed on node 214 and accordingly generates the plurality of slow digital control signals $V_{SD}$<0>, $V_{SD}$<1>, . . . $V_{SD}$<N>. It is preferable to switch only one slow digital control signal $V_{SD}$<i> at a time, with all remaining other slow digital control signals $V_{SD}$<i> held at either a logic low or a logic high value, so that their corresponding capacitors are either essentially open-circuited or are generally well-grounded and therefore electrically "connected" to nodes 146, 148. By switching only one such slow digital control signal $V_{SD}$<i> at a time, then only one such pair of switching transistors (e.g., transistors 302.0, 303.0) is partially turned on at a time, and the resulting conductance peak described earlier (i.e., in respect to FIG. 4E) only occurs in a single transistor pair during its turn-on or turn-off transient. Moreover, the slow digital control circuit 306 is preferably configured to provide a very slow rise time and fall time on whichever slow digital control signal $V_{SD}$<i> changes logic state at any given time, while holding all other slow digital control signals quiescent at one of the static levels. This allows the value of the total capacitance to change much more slowly and reduces perturbations to the overall system.

Figure 9:
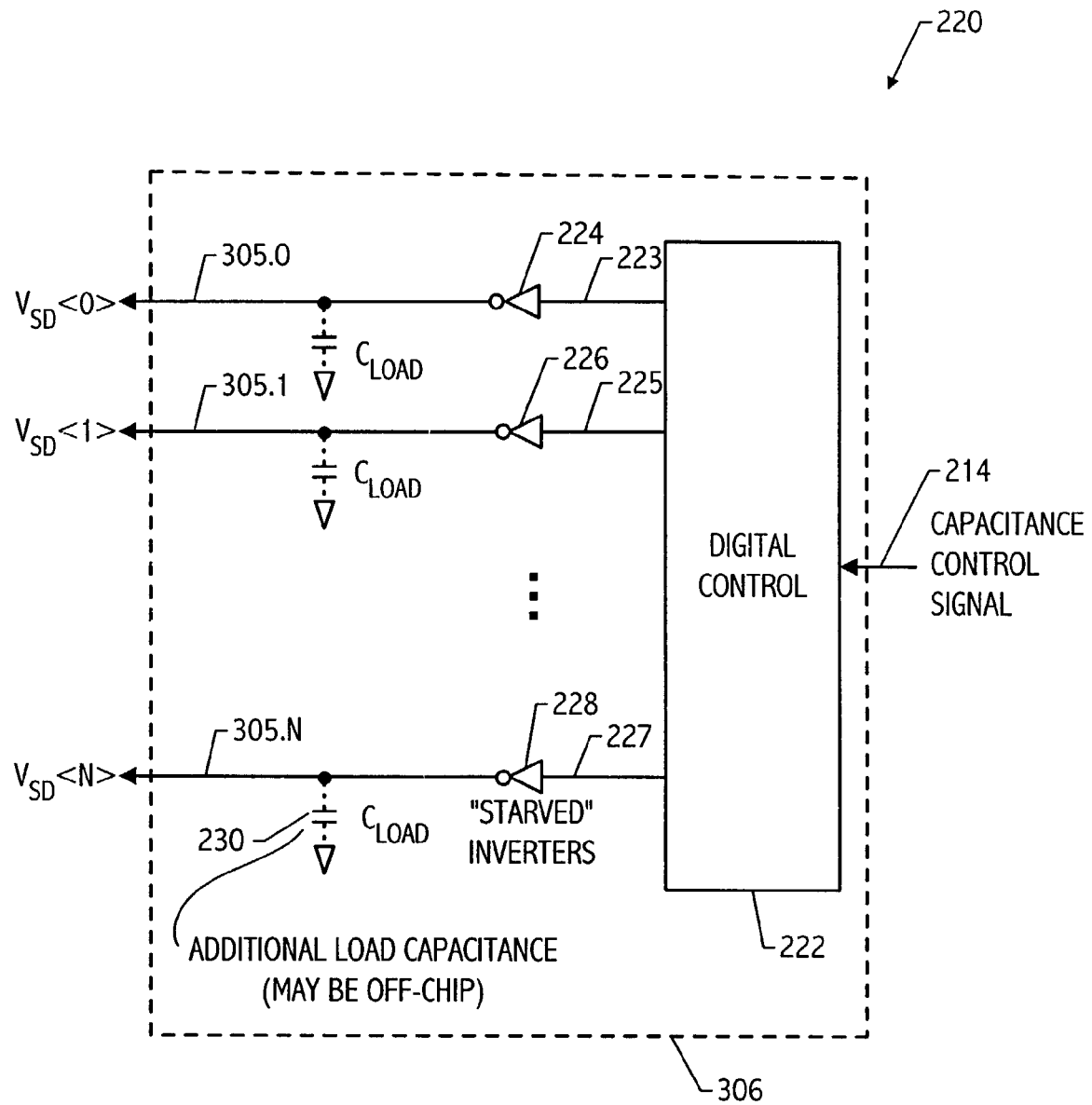
FIG. 9 is a schematic diagram of a gate control circuit useful for the circuit shown in FIG. 8.

Referring now to FIG. 9, a gate control circuit 220 is shown which is an exemplary embodiment of the slow digital control circuit 306 and which accomplishes slow rise and fall times on its various gate control output signals. A digital control circuit 222 receives the capacitance control signal 214 and generates each of the "slow digital" gate control signals $V_{SD}$<0>, $V_{SD}$<1>, . . . $V_{SD}$<N> so that at most only one changes state at a time. Each output 223, 225, . . . , 227 of the digital control circuit 222 is buffered by a respective "starved" inverter 224, 226, . . . , 228 which is intentionally undersized relative to its load capacitance so that its output rise and fall time is artificially slowed down compared to most other circuits. To achieve even slower transition times of the slow digital control signals, additional load capacitance, such as load capacitor 230, may be included on the various control signal output nodes, such as node 305.N. These load capacitors may be implemented on-chip or alternatively be provided external to the integrated circuit to allow larger capacitor sizes than is practical with numerous on-chip load capacitors.

Figure 10:
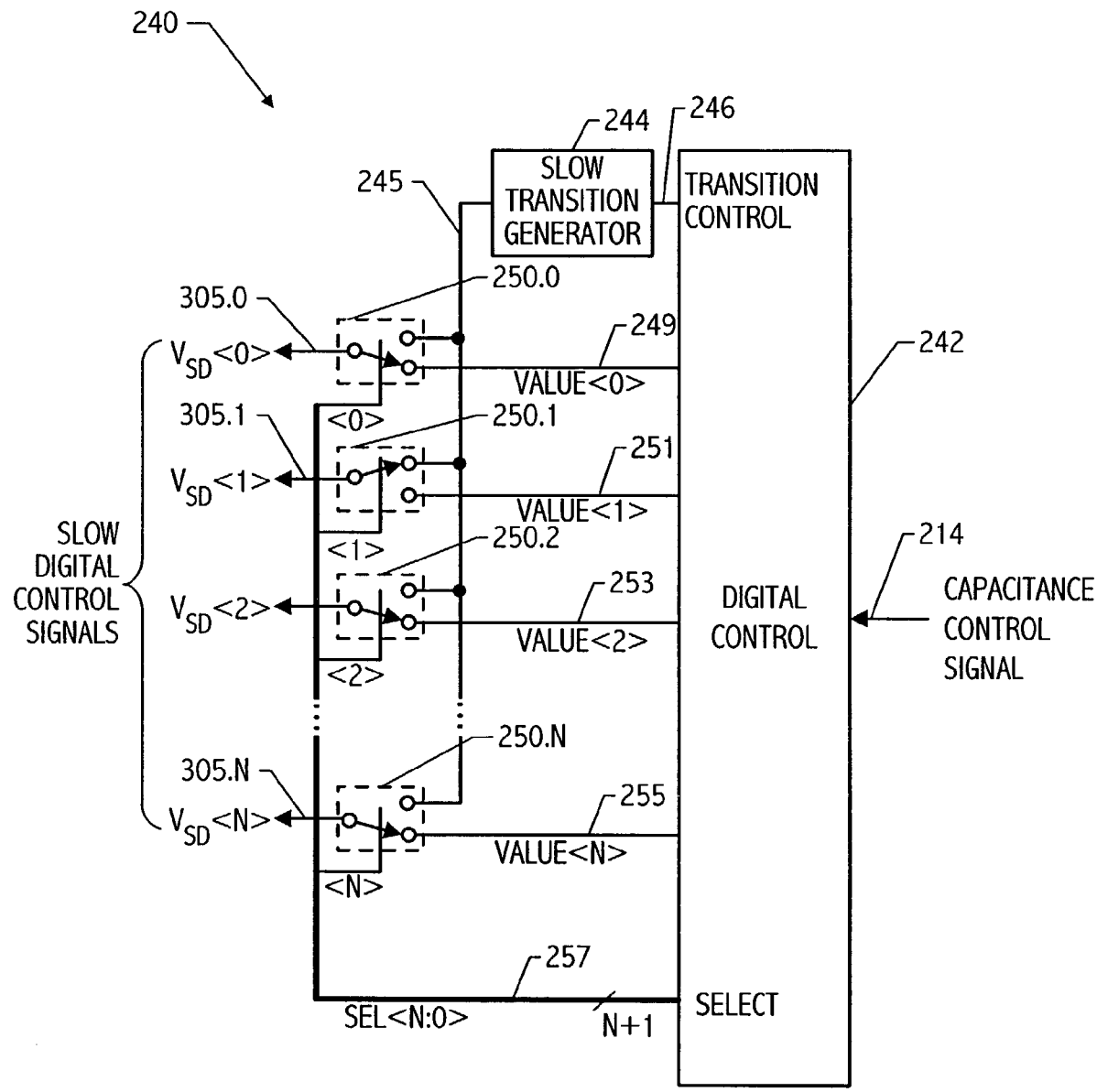
FIG. 10 is a schematic diagram of another gate control circuit useful for the circuit shown in FIG. 8.

Referring now to FIG. 10, a switch control circuit 240 is shown which is an exemplary embodiment of the slow digital control circuit 306 and which receives one or more capacitance control signal(s) 214 and generates accordingly a plurality of slow digital switch control signals. Moreover, the switch control circuit 240 accomplishes slow rise and fall times on its various control signal outputs without potentially utilizing a separate load capacitor on each control signal output. A digital control circuit 242 receives the capacitance control signal(s) 214 and generates the quiescent value for each switch control signal. A slow transition generator 244 is provided to generate on its output node 245 a signal having a slow risetime and a slow falltime which is shared as needed to generate each switch control signal. To cause a particular switch control signal $V_{SD}$<i> to change states from an "old value" to a "new value," the slow transition generator 244 output is first set to the "old value." The particular switch control signal node is disconnected from the corresponding output of the digital control circuit 242 and connected to the output of the slow transition generator 244. The slow transition generator is then commanded to transition its output from the "old value" to the "new value," and the corresponding output of the digital control circuit 242 is brought to the "new value" preferably during this transition. Alternatively, the corresponding output of the digital control circuit 242 may be brought to the "new value" after the transition. The particular switch control signal node is then disconnected from the output of the slow transition generator 244 and then reconnected to the corresponding output of the digital control circuit 242 to maintain the "new value." Since preferably only one such switch control signal is changed at a time, a single slow transition generator 244 may be shared without contention. Alternatively, each output of the digital control circuit 242 could also be provided with a corresponding slow transition generator, or a smaller group of slow transition generators could be shared among a larger number of potential outputs.

Looking in detail again at FIG. 10, the switch control circuit 240 generates a plurality of slow digital control signals $V_{SD}<0>$, $V_{SD}<1>$, $V_{SD}<2>$, ... $V_{SD}<N>$. There can be any of a variety of choices for the exact number of such gate control signals, which may be collectively referred to as $V_{SD}<N:0>$ or alternatively as the group of signals $V_{SD}<i>$. The quiescent value of each slow digital control signal $V_{SD}<0>$, $V_{SD}<1>$, $V_{SD}<2>$, ... $V_{SD}<N>$ is generated by the digital control circuit 242 on a corresponding one of a plurality of its outputs VALUE<0>, VALUE<1>, VALUE<2>, ... VALUE<N>. Normally each slow digital control signal $V_{SD}<i>$ is connected through a corresponding switch 250.i to a corresponding VALUE<i> output signal of the digital control circuit 242. The digital control circuit 242 also generates a plurality of select signals SEL<N:0> to control which slow digital control signal $V_{SD}<i>$ is connected to the output of the slow transition generator 244. Preferably at most one of the SEL<i> signals is active to connect the corresponding slow digital control signal $V_{SD}<i>$ to the output of the slow transition generator 244 (i.e., preferably using a "one-hot" coding), with each remaining SEL<i> signal being inactive to connect the corresponding slow digital control signal $V_{SD}<i>$ to the corresponding VALUE<i> output signal. Quiescently, preferably none of the SEL<i> signals are active, and consequently each slow digital control signal $V_{SD}<i>$ is connected to the corresponding VALUE<i> output signal of the digital control circuit 242. Lastly, at least one transition control signal is generated by the digital control circuit 242 and conveyed on node(s) 246 to the slow transition generator 244 to control the level (and possibly the rise and/or fall time) of the slow transition output signal conveyed on node 245. As configured herein, each respective switch 250.i functions in effect as a multiplexer circuit to connect the respective $V_{SD}<i>$ signal to either the respective VALUE<i> signal or to the shared slow transition signal on node 245.

The slow transition generator 244 may be implemented using any of a variety of suitable circuits, including a starved inverter (with or without a separate load capacitor, which could even be an off-chip load capacitor) as described above. In such a case the transition control signal conveyed on node 246 may be a voltage level signal carried on a single node. A preferable implementation of the slow transition generator 244 includes a digital-to-analog converter circuit (DAC) which receives a digital control word from the digital control circuit 242 and generates an analog voltage accordingly. In this case the transition control signal is preferably an M-bit digital word and the node 246 is preferably an M-bit bus rather than a "single wire". The transition of such a DAC's output signal from an "old value" to the "new value" may be accomplished arbitrarily slowly by sequencing the digital control word through all the intermediate values between those corresponding to the "old" and "new" values. Such sequencing may be accomplished at any arbitrarily slow rate since it is controlled by the digital control circuit 242. In such a configuration, the output of the DAC follows a stair-step pattern. However, if the precision of the DAC is sufficiently high, the magnitude of the individual "steps" may be quite small, and the resulting waveform may generally be a reasonably linear and arbitrarily long "slow ramp." Thus, as used herein, the output signal of a slow transition generator or other "ramp generator" need not be a true linear ramp in a literal sense, but rather a signal having a controlled slow transition.

As a detailed example for additional clarity, suppose that the capacitance control signal conveyed to the digital control circuit 242 on node 214 calls for an increase in the capacitance between nodes 146 and 148. Assume that the slow digital control signal $V_{SD}<1>$ conveyed on node 305.1 is initially at a low voltage, and the associated switch transistor (e.g., transistors 302.1 and 303.1) are turned off. Further assume that the digital control circuit 242 determines that the desired increase in total capacitance is to be accomplished by transitioning the slow digital control signal $V_{SD}<1>$ to a high voltage level, which serves to turn on the associated switch transistors 302.1 and 303.1. The slow digital control signals $V_{SD}<i>$ are preferably full CMOS level signals with a low level equal to ground and a high level equal to VDD (e.g., 2.5 V), while the switch transistors 302.1 and 303.1 are preferably enhancement mode FETs, which for this instructive example will also be assumed.

If the slow transition generator output on node 245 is not already low, the transition control signal on node 246 is first driven appropriately to cause the slow transition generator 244 to drive its output node 245 to ground. Then the SEL<1> signal is driven active to disconnect the slow digital control signal $V_{SD}<1>$ from the VALUE<1> output signal, and to connect the $V_{SD}<1>$ signal to the output of the slow transition generator 244 (as shown in FIG. 10). Each remaining SEL<i> signal remains inactive to connect the corresponding $V_{SD}<i>$ signal to the corresponding VALUE<i> output signal. Next, the transition control signal on node 246 is driven appropriately to cause the slow transition generator 244 to drive its output node 245 to VDD (with a controlled and preferably very slow rise time, of course). At preferably about the same time, the VALUE<1> output signal is driven from ground to VDD, which may occur with a normal rise time. Lastly, the SEL<1> signal is driven inactive to disconnect the $V_{SD}<1>$ signal from the output of the slow transition generator 244 and reconnect it to the VALUE<1> output signal, which maintains the VDD level on the $V_{SD}<1>$ signal and allows the slow transition generator 244 to be used for "transitioning" another slow digital control signal when needed. The particular VALUE<1> output signal may be driven (in this example from ground to VDD) at any convenient time whenever the $V_{SD}<1>$ signal is disconnected from the VALUE<1> output signal, which may be prior to, during, or after the slow transition generator output signal on node 245 is caused to transition with its slow ramp.

One skilled in the art may appreciate a wide variety of specific configurations and sequences which may be advantageously utilized with the basic structure shown in FIG. 10. For example, the slow digital control signal $V_{SD}<1>$ may remain connected to the output of the slow transition generator 244 after its output transition is complete without reconnecting the VSD<1> signal to the VALUE<1> output signal. When the slow transition generator is needed again, the $V_{SD}<1>$ signal may be then reconnected to the VALUE<1> output signal, and the slow transition generator made available to drive another slow digital control signal. However, if power dissipation is a concern, it may be preferable to disconnect the slow transition generator 244 from the driven signal once its transition is complete, as described above, and power-down the entire slow transition generator 244 until needed again.

Each of the switches 250.i (collectively referring to switches 250.0, 250.1, ... through 250.N) may be implemented easily by using a full CMOS transfer gate structure (an NMOS FET and a PMOS FET driven with complementary signals) or an equivalent thereto. Alternatively, a single polarity transfer gate (either NMOS or PMOS) may also be used if the particular static voltages chosen for the low level and high level, relative to VDD and ground, may be communicated adequately. Other circuits may conceivably also be used, as the performance of such switch circuits are not critical and there is negligible current flow through the switches. Suitable implementations of the digital control circuit 242 and the slow transition generator 244 may be straightforwardly carried out by those skilled in the art based on the teaching herein.

Figure 11:
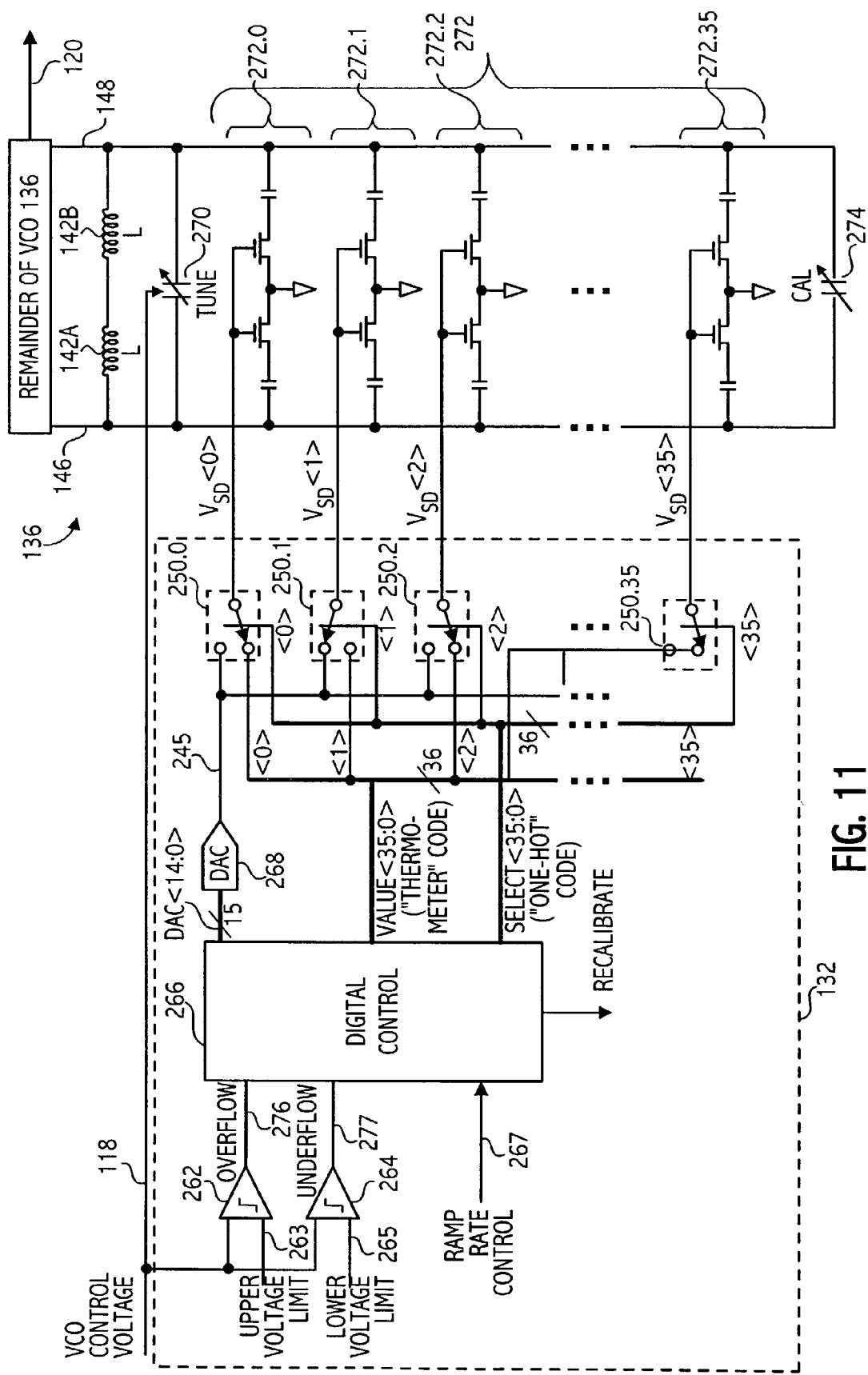
FIG. 11 is a schematic diagram of a circuit in accordance with an embodiment of the present invention.

A switch control circuit similar to the above-described switch control circuit 240 may be advantageously incorporated within the digital control block 132 of the phase locked loop 130 (as depicted in FIG. 2). Referring now to FIG. 11, an exemplary embodiment is shown of a portion of the phase locked loop 130 earlier described in relation to FIG. 2. A portion of the VCO 136 is shown in detail which includes a symmetrical pair of series connected inductors 142A and 142B, and three variable capacitance circuits 270, 272, and 274, each coupled between nodes 146 and 148 to form a tunable LC tank circuit for the remainder of the VCO 136. Since an on-chip inductor is typically implemented as a spiral inductor (having an inner terminal and an outer terminal), two symmetrical inductors are preferably implemented in series to achieve a more balanced circuit. These three variable capacitance circuits 270, 272, and 274 (as well as stray capacitances) together determine the total capacitance of nodes 146 and 148 and thus collectively determine the frequency of the VCO 136. The first of these variable capacitance circuits, labeled 270, is controlled by the VCO control voltage signal 118 and is the primary tunable circuit element for normal operation of the phase locked loop. Such a variable capacitance circuit 270 is preferably implemented generally as described in regards to FIG. 5, and more preferably as described below.

The second of the variable capacitance circuits, collectively labeled as 272, receives a plurality of dynamically changeable slow digital gate control signals $V_{SD}<0>$, $V_{SD}<1>$, ... $V_{SD}<35>$ from the digital control block 132 which collectively adjust the total capacitance of (i.e., "between") nodes 146 and 148 so that the VCO control voltage 118 dynamically operates at a nominal voltage reasonably centered within its available voltage range. This second variable capacitance circuit 272 is preferably used to compensate for environmental changes (e.g., temperature and/or voltage changes) and parametric changes (e.g., component parameters, such as threshold voltage) that may occur during operation and particularly well after any power-up calibration. Such a variable capacitance circuit 272 is preferably implemented generally as described in regards to FIG. 8 through FIG. 10, and more preferably as described in regards to FIG. 11 and as further described below.

The third of the variable capacitance circuits, labeled 274, is preferably adjusted during a calibration routine at power-up, after reset, or if the slow switched variable capacitance circuit 272 is out of range, to a static value that nominally allows the VCO control voltage 118 to operate reasonably centered within its available voltage range. This third variable capacitance circuit 274 is preferably used to compensate for normal manufacturing variations in semiconductor parameters as fabricated, as well as to compensate for the initially-encountered values of the environmental variables during each powering-up of the device. Such a variable capacitance circuit 274 is preferably implemented generally as described in regards to FIG. 7, and more preferably as described below.

In operation, the digital control block 132 senses the VCO control voltage 118 to determine whether it remains within a predetermined portion of its operating range (preferably somewhat centered within its operating range). Whenever the VCO control voltage 118 falls outside this range, the digital control block 132 adjusts very, very slowly the value of the variable capacitance circuit 272. Absent the phase locked loop 130, such a change would result in a change of VCO frequency. But to remain in phase and frequency lock, the phase locked loop 130 responds to the changing value of the variable capacitance circuit 272 by adjusting the VCO control voltage 118 by an amount which results in an equal but offsetting change in capacitance of the variable capacitance circuit 270. Consequently, the VCO frequency remains unchanged. The digital control block 132 preferably adjusts the value of the variable capacitance circuit 272 either upwards or downwards, as appropriate, to "drive" the VCO control voltage 118 toward the center of its operating range. For example, assume that a higher VCO control voltage 118 corresponds to a higher value of the variable capacitance circuit 270 (i.e., compared to lower values of the VCO control voltage 118). If the digital control block 132 senses that the VCO control voltage 118 is too high, one or more of the gate control signals $V_{SD}<i>$ are preferably driven so as to increase the value of variable capacitance circuit 272. The phase locked loop 130 responds by driving the VCO control voltage 118 downward by an amount which results in a decrease in value of the variable capacitance circuit 270 by an amount equal to the increase in value of the variable capacitance circuit 272. The VCO frequency thus remains unchanged, but the VCO control voltage 118 has been driven toward the center of its operating range. By so doing, the phase locked loop operation is improved because the VCO control voltage operates nearer to the center of its range, and in particular, never operates close to either extreme of its range, and consequently improves performance by reducing the sensitivity to the voltage on node 118.

With this understanding presented thus far, the operation of the circuitry depicted in FIG. 11 should be readily apparent to one skilled in the art. Nonetheless, several details warrant discussion. The second of the variable capacitance circuits, collectively labeled as 272, is formed of a plurality of individual variable capacitance circuits 272.0, 272.1, 272.2, ... 272.35, each of which receives a respective one of a corresponding plurality of dynamically changeable slow digital gate control signals $V_{SD}<0>$, $V_{SD}<1>$, ... $V_{SD}<35>$ from the digital control block 132. Thirty-six such individual variable capacitance circuits (as shown) is a particularly advantageous number, although other choices may be equally advantageous depending upon the application.

In this embodiment a DAC 268 is used to generate a controlled slow rise and fall time (both high-going and low-going) as described above. A 15-bit control word is generated by the digital control block 266 to communicate the desired value of the DAC's output signal conveyed on node 245 to each of the individual switches 250.$i$. Such a 15-bit DAC provides 32768 individual voltage levels that may be generated on its output, which allows its output waveform to be generated with an arbitrarily long transition time, yet one having relatively small "stair-steps" and thus relatively smooth. For example, if the full-scale transition of the DAC 268 is from 0.0 to 2.5 volts, the magnitude of each stair step is approximately 76 μV. Such transitions on node 245 may be generated as linear voltage ramps, as well as more complex functions of voltage vs. time. Although a DAC having 15-bit resolution is incorporated in this embodiment, other resolutions may also be used. For example, a DAC having 10-bit resolution may provide sufficiently small granularity to achieve adequate performance in many applications. Other resolutions, such as 4 bits, 6, bits, or 8 bits, may also be chosen.

A pair of comparators 262, 264 monitor the voltage of the VCO control voltage 118 to determine whether it is too high or low in magnitude. Comparator 262 compares the VCO control voltage 118 to an upper voltage limit signal conveyed on node 263 and generates an OVERFLOW signal on node 276 which is communicated to the digital control block 266. Comparator 264 compares the VCO control voltage 118 to a lower voltage limit signal conveyed on node 265 and generates an UNDERFLOW signal on node 277 which is likewise communicated to the digital control block 266. Comparators 262 and 264 are each preferably implemented having 50–200 mV of hysteresis to prevent its respective output from chattering when its input is near its threshold voltage, and more preferably each have about 100 mV of hysteresis.

Using any of a variety of well-known and not particularly critical design techniques, the digital control block 266 generates the DAC control word DAC<14:0>, the element value signals VALUE<35:0>, and the switch selection signals SELECT<35:0>, preferably in a fashion to behave consistently with the above description. For example, the element value signals VALUE<35:0> are preferably driven with a "thermometer code" in which each additionally driven-high signal is adjacent to the most recently driven-high signal. Nonetheless, such coding is not required, and any coding in which additional or lesser numbers of the element value signals are driven high or low to accomplish a desired change in capacitance of the variable capacitance circuit 272, as described above, is equally satisfactory. The switch select signals SELECT<35:0> are preferably driven with a "one-hot" coding so that, at most, only one individual variable capacitance circuit 272.i is connected to the DAC 268 and is potentially changing in value at any given time. However, other schemes are possible. For example, two or more such individual variable capacitance circuits 272.i could be driven at the same time with a gate control voltage having a slowly-changing voltage magnitude, although the perturbation to the VCO 136 may be more significant. The digital control block 266 also preferably generates a RECALIBRATE signal which is asserted when an UNDERFLOW or OVERFLOW signal is generated which attempts to adjust the slow digital capacitance circuit 272 beyond its control range. A recalibration of the DC calibration capacitance circuit 274 may then be performed to re-center the control voltage 118 and the slow-switched variable capacitance circuit 272.

The digital control block 266 receives a RAMP RATE CONTROL signal conveyed on node 267 to provide for different ramp rates (i.e., transition times) on the DAC output node 245. When the phase locked loop 130 is configured for a clock and data recovery application, the transition time is advantageously varied as a linear function of bit data rate. For example, for a 2.4 Gbit/second data rate (OC-48), a full-scale transition time on node 245 of 164 milliseconds is particularly desirable to allow the phase locked loop 130 to maintain lock during the ramp time, while for a much slower 155 Mbit/second data rate (OC-3), a transition time of 2.62 seconds is particularly desirable. As described above, with sufficient precision, the DAC 268 can easily generate such a slow ramp time, yet still produce an output signal that approximates a relatively smooth, linear voltage waveform. At such slow ramp times, of particular advantage is the ability of the phase locked loop 130 to maintain performance within virtually identical specifications as if no variable capacitance circuit 272.i was being changed. For example, such a phase locked loop 130 may achieve jitter tolerance and jitter generation performance during a transition which is substantially equal to its steady-state performance. Said differently, long term parametric drifts, slow temperature changes, and slow voltage changes may be compensated without negatively impacting the jitter tolerance, jitter generation, or other subtle performance specifications of the phase locked loop 130. Preferably, the transition time is chosen to balance the competing desires of being fast enough to adequately track anticipated environmental changes, yet being slow enough to preserve performance specifications, such as jitter tolerance and jitter generation, during the transition. With the relatively slow rate of environmental changes likely to be encountered in, for example, a SONET application, the transition time may preferably be chosen to be much slower than that believed merely adequate to preserve performance specifications, and still be fast enough for the anticipated rate of environmental changes.

Referring now to FIG. 12, a preferred embodiment of a single stage 272.i within the "slow digital" variable capacitance circuit 272 is shown. A pair of P-channel precharge transistors 284 and 285 are included so that when the slow digital gate control signal $V_{SD}$<i> is low, the intermediate nodes 286 and 287 are respectively coupled to nodes 146 and 148. This prevents the voltage of such intermediate nodes 286 and 287 from slowly discharging or otherwise floating, which could cause unwanted noise on the LC tank circuit nodes 146 and 148 and injection from the intermediate nodes to the local substrate. The precharge transistors 284 and 285 are both gated by a common PRE<i> signal whose low level is preferably ground and whose high level is an internally regulated value below VDD so that the respective gate terminals of transistors 284 and 285 are not driven too much higher than the respective source terminals (i.e., nodes 146 and 148). These PRE<i> signals are preferably also generated by the digital control block 266 (connection not shown). Such technique is described and explained in greater detail in U.S. Pat. No. 6,147,567 to Welland, et al, which is incorporated herein by reference in its entirety.

An exemplary relative timing of the PRE<i> signal and $V_{SD}$<i> signal for a given stage 272.i are depicted in FIG. 13. When the $V_{SD}$<i> signal is low, the PRE<I> signal is also low. Before the $V_{SD}$<i> signal is transitioned from low to high, the PRE<i> signal is first brought high to turn off the precharge transistors 284.i and 285.i. Conversely, after the $V_{SD}$<i> is brought low, the PRE<i> signal is also brought low to respectively maintain the voltage of the intermediate nodes 286.i and 287.i at the voltage of tank nodes 146 and 148.

Figure 14:
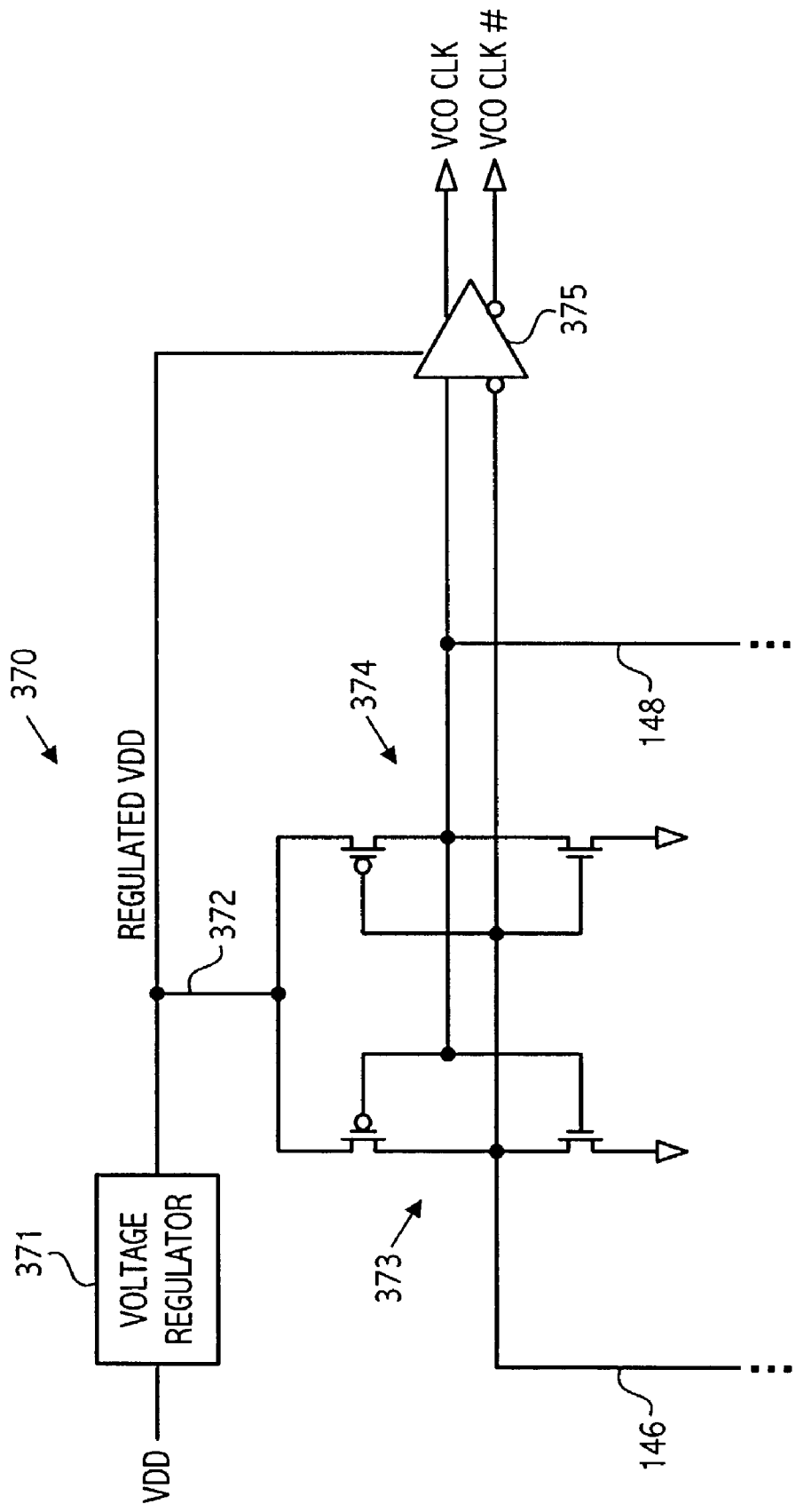
FIG. 14 is a schematic diagram of a portion of a VCO circuit useful for the circuit shown in FIG. 11.

Referring now to FIG. 14, a portion of a preferred embodiment of the VCO 136 is depicted. A pair of cross-coupled CMOS inverters 373 and 374 are coupled to the tank nodes 146 and 148 and provide gain to the resonant LC tank circuit described above. A voltage regulator 371 is provided to generate a regulated VDD for the VCO to reduce the effects of noise on VDD as well as reduce the variation of nominal VCO operating frequency caused by variations in the VDD level. A differential clock buffer 375 receives the signals on the differential tank nodes 146 and 148 and generates a buffered pair of differential VCO CLK signals labeled VCO_CLK and VCO_CLK#.

Figure 15:
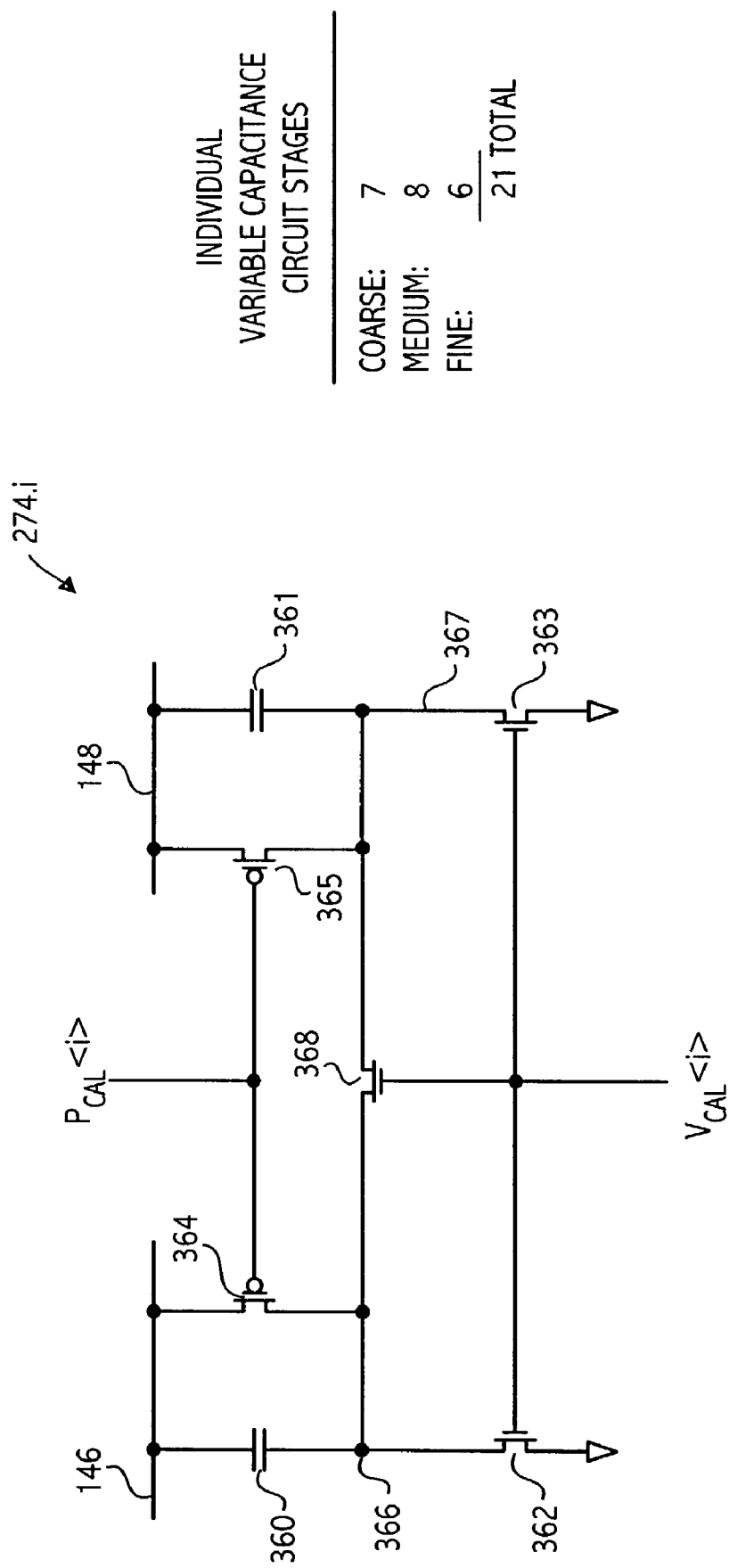
FIG. 15 is a schematic diagram of a circuit useful for the circuit shown in FIG. 11.

Referring now to FIG. 15, a preferred embodiment of a single stage 274.i within the DC calibration variable capacitance circuit 274 is shown. A pair of P-channel "precharge" transistors 364 and 365 are turned on when the calibration control signal $V_{CAL}$<i> is low so that the intermediate nodes 366 and 367 are respectively coupled to nodes 146 and 148.

This prevents the voltage of such intermediate nodes 366 and 367 from slowly discharging or otherwise floating, which could cause unwanted noise on the LC tank circuit nodes 146 and 148 and injection from the intermediate nodes to the local substrate. The precharge transistors 364 and 365 are both gated by a common $P_{CAL}$<i> signal whose low level is preferably ground and whose high level is an internally regulated value below VDD so that the respective gate terminals of transistors 364 and 365 are not driven too much higher than the respective source terminals (i.e., nodes 146 and 148).

The relative timing of the $P_{CAL}$<i> signal and $V_{CAL}$<i> signal for an individual variable capacitance circuit stage 274.i are not particularly critical. They can be switched substantially together, or alternatively may be sequenced so that before the $V_{CAL}$<i> signal is switched from low to high, the $P_{CAL}$<i> signal is first brought high to turn off the precharge transistors 364.i and 365.i. Conversely, the $P_{CAL}$<i> signal may be brought low after the $V_{CAL}$<i> signal is low enough to turn off the transistors 362.i and 363.i so that unnecessary current does not flow from nodes 146 and 148 to ground. Additional details of such calibration techniques and circuits are described and explained in U.S. Pat. No. 6,147,567 which is incorporated herein by reference in its entirety.

The various individual variable capacitance circuits 274.i may be sized identically, or may be individually weighted to achieve a range of control using fewer individual stages. To reduce calibration time, a particularly desirable configuration includes three groups of capacitance circuits weighted to achieve a course, medium, and fine tuning control during the DC calibration. The fine control section preferably includes six such variable capacitance circuits 274.i which are preferably evenly weighted, and each sized to preferably cause about a 0.125% change in VCO frequency when one such circuit is switched in or out. The medium control section preferably includes eight such variable capacitance circuits 274.i which are preferably evenly weighted and sized to be four times larger than each of the fine control circuits. The course control section preferably includes seven such variable capacitance circuits 274.i which are preferably evenly weighted and sized to be eight times larger than each of the medium control stages. Alternatively, the variable capacitance circuits 274.i need not be evenly weighted, but may be weighted using a radix of two, or alternatively a radix somewhat less than two.

The calibration routine preferably first adjusts the course array, switching one element at a time in a "thermometer code" fashion until the VCO is close to the desired frequency. Then the medium section is adjusted in the same thermometer code fashion to get closer to the desired frequency. Lastly, the fine control stages are adjusted in the same thermometer code fashion to achieve an even finer frequency resolution and get even closer to the desired frequency. The tuning range overlap of the fine control section over the medium control section, and the medium control section over the course control section provides that even with a mismatch of certain stages, no large frequency gap is present over which the calibration routine cannot reach.

As depicted in the variable capacitance circuit 274.i, a lateral transistor 368 may be included to connect the intermediate node 366 between capacitor 360 and transistor 362 to the intermediate node 367 between capacitor 361 and transistor 363. This additional transistor 368 lowers the impedance of the grounding path and is preferably used in the larger such circuits, preferably only in the course and medium control circuits. Such a technique is more fully explained in the above-referenced U.S. Pat. No. 6,147,567 to Welland, et al.

Figure 16:
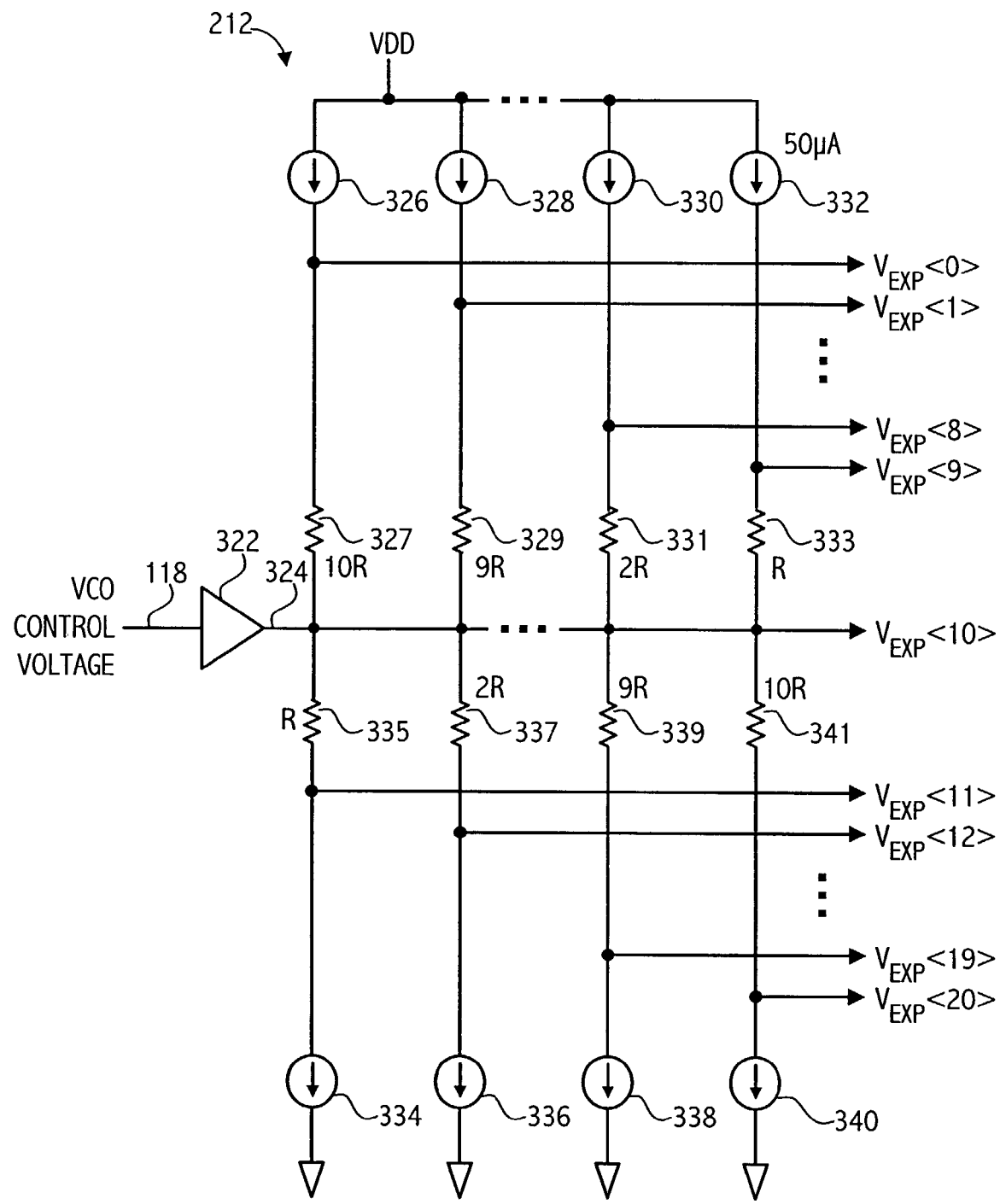
FIG. 16 is a schematic diagram of an embodiment of a voltage expansion circuit.

Referring now to FIG. 16, a preferred voltage expander 212 is illustrated which generates twenty-one expanded voltage $V_{EXP}$<i> signals, one of which having a voltage substantially equal to the input voltage, with one half of the remaining $V_{EXP}$<i> signals higher in voltage than the input voltage, and the other half of the remaining $V_{EXP}$<i> signals lower in voltage than the input voltage. A buffer 322 receives the VCO control voltage 118 and generates on its output node 324 the $V_{EXP}$<10> signal preferably having substantially the same voltage as its input voltage. The buffer 322 preferably drives its output node 324 with a relatively low output impedance, for reasons described below.

Assuming briefly that node 324 is held robustly at its desired voltage (e.g., equal to the VCO control voltage), the first one of the $V_{EXP}$<i> voltage signals, namely $V_{EXP}$<0>, is generated by passing a controlled current from current source 326 through a resistor 327 whose other terminal is anchored at the voltage of node 324. The desired voltage offset between node 324 and the $V_{EXP}$<0> signal may be accomplished by adjusting the magnitude of either or both of the current source 326 or the resistor 327. Each of the respective remaining $V_{EXP}$<i> voltage signals is generated by passing a controlled current from a respective current source through a respective resistor having a predetermined value which is connected to node 324.

In the embodiment shown, half of the $V_{EXP}$<i> signals (i.e., $V_{EXP}$<0> through $V_{EXP}$<9>) have a voltage higher than the voltage of node 324, while the other half of the $V_{EXP}$<i> signals (i.e., $V_{EXP}$<1> through $V_{EXP}$<20>) have a voltage lower than the voltage of node 324. One particular advantage of this arrangement is the balancing of current flow into node 324 with the current flow from node 324. For example, if the magnitude of current source 326 is identical to that of current source 334, then no net current flows into or from node 324. The buffer 322 functions to provide the voltage on node 324, but the output impedance of buffer 322 need not absorb any net current into node 324. Similarly, the aggregate current flow of current sources 326, 328, . . . , 330, and 332 is preferably substantially identical to the aggregate current flow of current sources 334, 336, . . . , 338, and 340. Consequently, the net current flow into node 324 is essentially zero and the output impedance demands of buffer 322 are reduced substantially. In the preferred embodiment shown, the value of each current source is preferably 50 microamps, and each resistor shown is a multiple of a unit resistor R having a value equal to 2.7 kOhms. For example, resistor 333 has a preferred value of 2.7 kOhms, while resistor 327 has a preferred value of 27 kOhms. As a result, the voltage difference between each adjacent expanded voltage $V_{EXP}$<I> is preferably 135 mV. Referring briefly back to FIG. 6, the upper limit ($V_2$) and lower limit ($V_1$) of the twenty-one expanded voltage signals $V_{EXP}$<i> are preferably 2.1 and 0.3 volts, respectively, which may be accomplished using traditional current source (current mirror) structures and supply voltages of, for example, 2.5 volts and ground.

Figure 17:
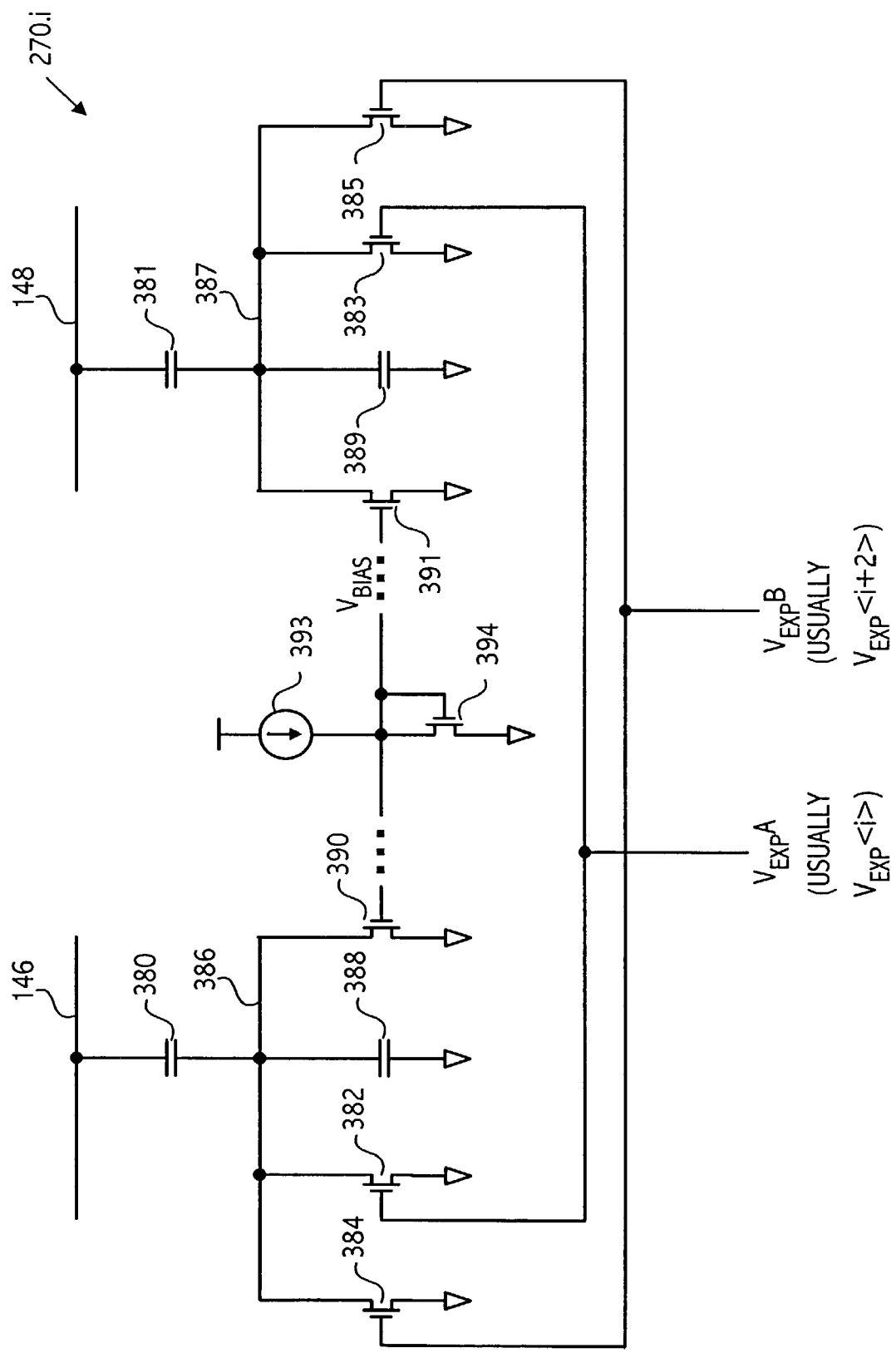
FIG. 17 is a schematic diagram of a circuit useful for the circuit shown in FIG. 11.

Referring now to FIG. 17, an exemplary embodiment of an individual stage 270.i within the continuously variable capacitance circuit 270 (i.e., the PLL "tuning" capacitance circuit) is shown. This circuit is similar to the earlier described variable capacitance circuit 144 having a pair of capacitors 380 and 381 respectively coupled to tank nodes 146 and 148, and which are coupled to ground through respective transistors 382 and 383. The preferred circuit stage also includes a pair of transistors 390 and 391 having a low-level DC bias voltage $V_{BIAS}$ impressed upon their gate terminals, each of which acts as a high-valued resistor connected to the respective intermediate node 386 and 387. The $V_{BIAS}$ voltage is preferably generated by a current source 393 flowing through a diode-connected transistor 394 and communicated to each individual stage. Moreover, in those stages whose capacitors 380 and 381 are very small, another pair of fixed capacitors 388 and 389 are connected respectively between the respective intermediate node and ground. Such circuits are described in additional detail in U.S. Pat. No. 6,147,567 which is incorporated herein by reference in its entirety.

The preferred circuit stage depicted also includes a second pair of transistors 384 and 385, and receives a pair of expanded voltage signals $V_{EXP}A$ and $V_{EXP}B$ rather than just one such expanded voltage signal. For the nineteen of the preferred twenty-one total circuit stages, two expanded voltage signals $V_{EXP}<i>$ and $V_{EXP}<i+2>$ (i.e., separated by one expanded voltage signal) are received by the stage. For example, one such stage receives $V_{EXP}<2>$ and $V_{EXP}<4>$, the next stage receives $V_{EXP}<3>$ and $V_{EXP}<5>$, and so forth. The two end-most stages receive two adjacent expanded voltage signals ($V_{EXP}<0>$ and $V_{EXP}<1>$ for one, and $V_{EXP}<19>$ and $V_{EXP}<20>$ for the other). By including a transistor responsive to each of two such expanded voltage signals, a greater linearity is achieved for a given variable capacitance stage, and consequently there is a greater linearity of the entire circuit than would be otherwise expected for a given number of individual stages (here shown as twenty-one such stages).

Figure 18:
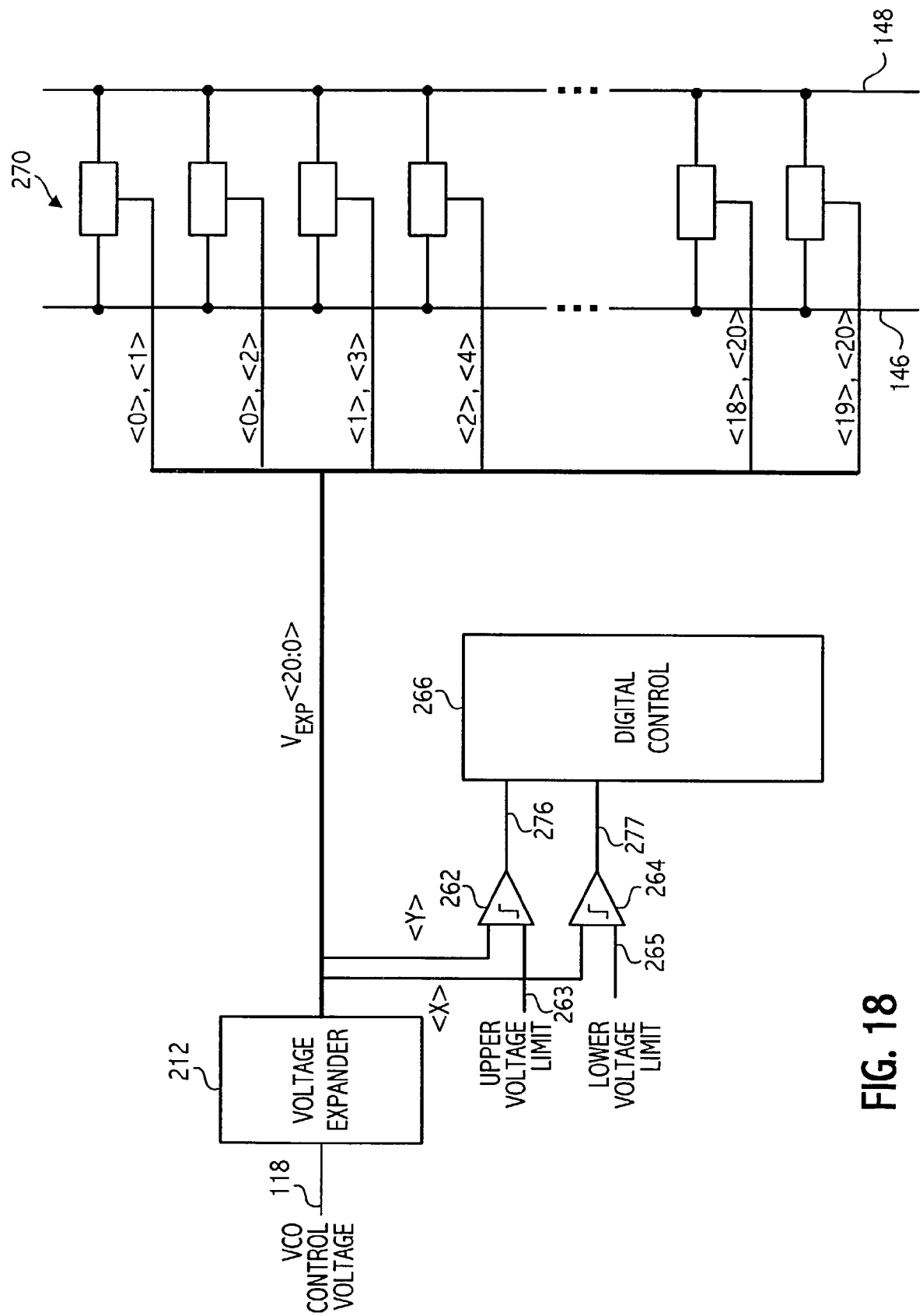
FIG. 18 is a schematic diagram of a circuit embodiment in accordance with the present invention.

Referring now to FIG. 18, another embodiment of the earlier-described circuit of FIG. 11 is shown which depicts a preferred embodiment of the continuously-variable capacitance circuit 270 and other details of related portions of the circuit. In particular, the voltage expander 212 is shown receiving the VCO control voltage 118 and generating a group of twenty-one expanded voltage signals $V_{EXP}<20:0>$ which are conveyed in pairs to individual variable capacitance circuit stages 270.i as described above. As before, a pair of comparators 262, 264 essentially monitor the voltage of the VCO control voltage 118 to determine whether it is too high or low in magnitude. Specifically, the comparator 262 preferably compares a particular expanded voltage signal $V_{EXP}<Y>$ to the upper voltage limit signal conveyed on node 263 and generates an OVERFLOW signal on node 276 which is communicated to the digital control block 266. The comparator 264 preferably compares a second particular expanded voltage signal $V_{EXP}<i>$ to the lower voltage limit signal conveyed on node 265 and generates an UNDERFLOW signal on node 277 which is likewise communicated to the digital control block 266. Comparators 262 and 264 are each preferably implemented having 50–200 mV of hysteresis to prevent its respective output from chattering when its input is near its threshold voltage, and more preferably each have about 100 mV of hysteresis. Comparing a pair of expanded voltage signals $V_{EXP}<i>$ to infer the magnitude of the VCO control voltage 118 rather than comparing the VCO control voltage itself allows level shifting to better accommodate the desired input level for the comparators 262 and 264 and to ensure sufficient head-room for proper operation of each comparator, even for wide voltage excursions of the VCO control voltage 118.

Figure 19:
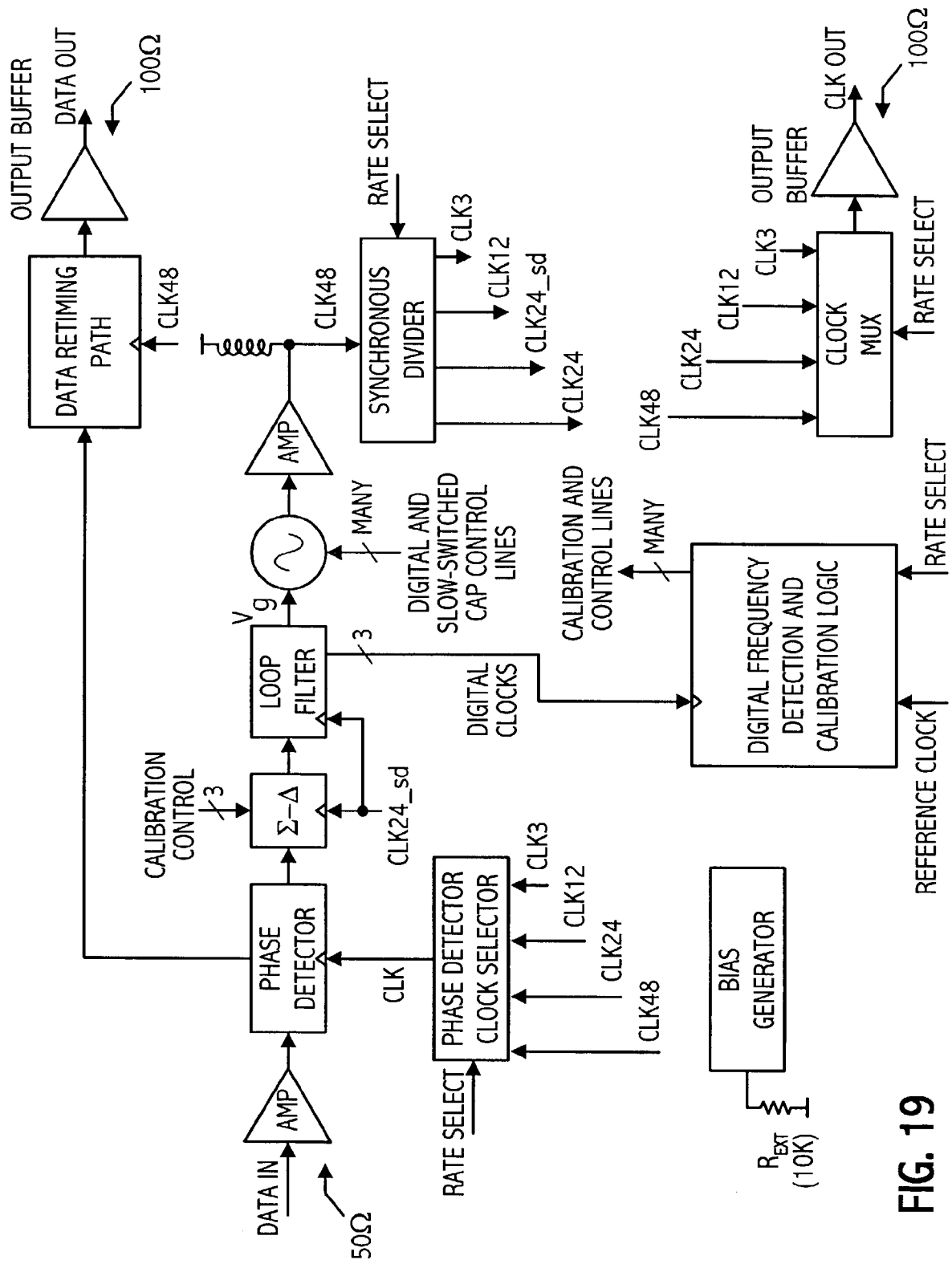
FIG. 19 is a block diagram of an exemplary clock and data recovery phase locked loop feedback system.

Referring now to FIG. 19, a block diagram is shown of a preferred clock and data recovery circuit utilizing the slow digital calibration of the VCO frequency as described above. Such a circuit is preferably calibrated at startup (or at a recalibration) to 2.5 GHz, +/−0.125% from a nominal frequency range as wide as 2.5 GHz +/−20% as fabricated. The slow digital switching capability is preferably arranged to provide a tracking range up to a +/−2.5% variation in frequency, to track aging of components and temperature and voltage variations over time. The tuning varactor within the PLL itself is preferably configured to provide a +/−0.5% tuning range over a typical varactor control voltage range from 0.5 to 1.5 volts.

The teachings described thus far may be utilized in a wide variety of circuits. For example, the slow digital switching of a plurality of variable capacitance circuits to achieve a very slowly varying capacitance between two nodes, as described above, may be extended to a plurality of variable resistor circuits to achieve a slowly varying resistance between two nodes.

Figure 20:
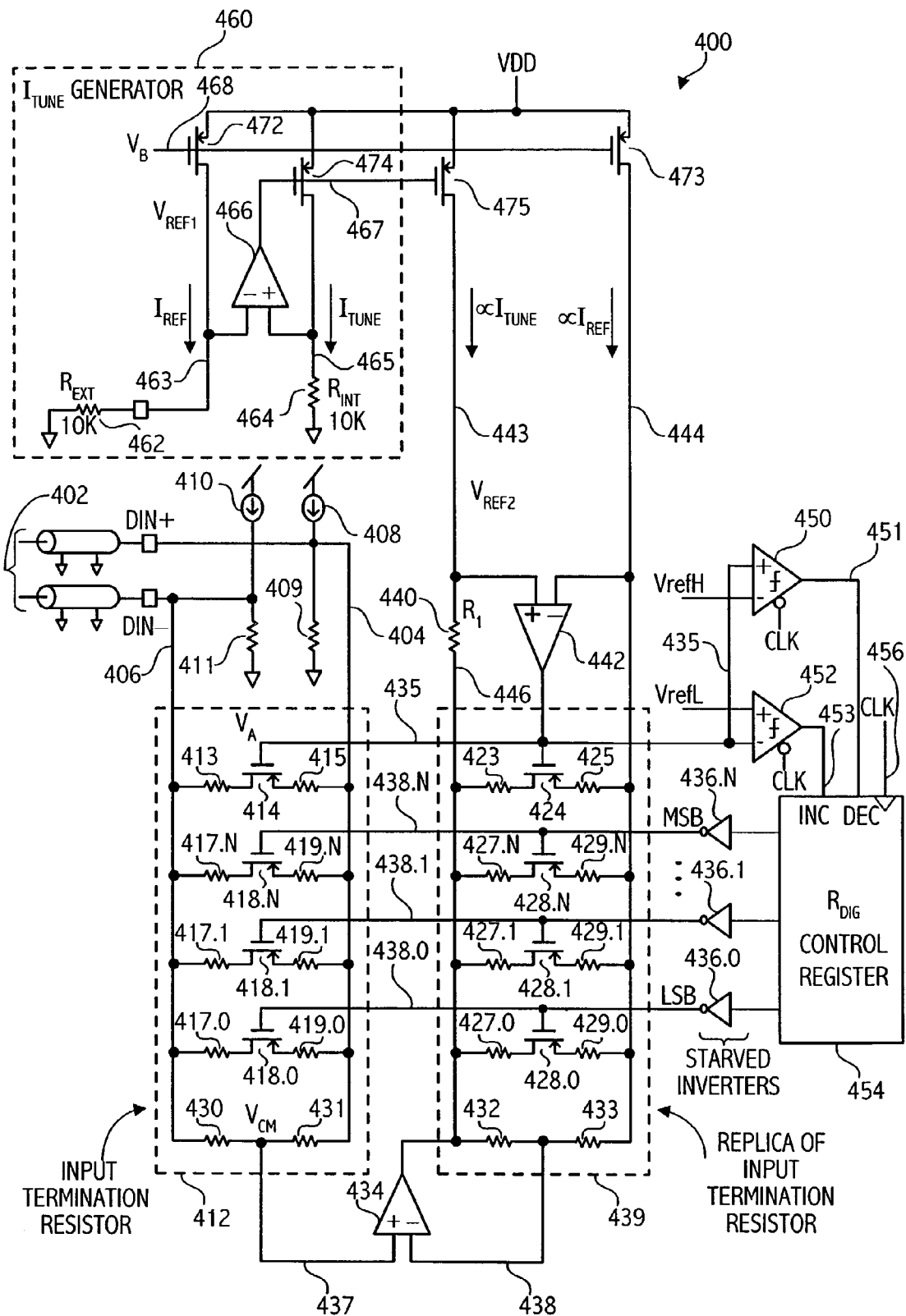
FIG. 20 is a schematic diagram of an exemplary variable resistance circuit.

Referring now to FIG. 20, an input impedance circuit 400 is shown which utilizes a slow-switching digital feedback path to constantly adjust the impedance of an on-chip input termination resistor without abrupt changes in its magnitude. If incorporated within a clock and data recovery circuit (CDR circuit), such abrupt changes in the input resistance could cause decreased jitter tolerance or worse, outright data errors. A pair of transmission lines 402 (i.e., having a controlled impedance) is shown communicating a positive data input signal DIN+ onto node 404 and communicating a negative data input signal DIN− onto node 406, which DIN+ and DIN− signals together form a differential input signal DIN. A current source 408 and resistor 409 together provide a bias for node 404, and a current source 410 and resistor 411 together provide a bias for node 406. An input termination resistor 412 is provided on-chip between the two input nodes 404 and 406, and preferably should always maintain a magnitude equal to twice that of the impedance of each transmission line 402.

The input termination resistor 412 includes two fixed resistors 430, 431 and a plurality of individual variable resistance circuits, each of which includes a first resistor, a transistor, and a second resistor connected together in series between nodes 404 and 406. The first such variable resistance circuit includes a transistor 414 (shown, for this embodiment, as a P-channel transistor) and two resistors 413, 415. When transistor 414 is conductive, a series circuit is formed between nodes 404 and 406 whose value is the sum of the two resistors 413, 415 and the channel resistance of transistor 414. While the resistance of resistors 413 and 415 is assumed to be relatively constant, the resistance of the transistor 414 channel may be varied by changing its gate voltage $V_A$ conveyed on node 435. When non-conductive (i.e., "off"), the resistance of transistor 414 is very high, and the series circuit degenerates to a virtual open circuit. Consequently the total resistance of the series circuit may be controlled by varying the gate voltage on node 435 to achieve a total series resistance which varies between an upper limit equal to an open circuit and a lower limit approaching the sum of the two resistors (assuming the transistor is large enough relative to the size of the two resistors). Lower values of the gate voltage $V_A$ conveyed on node 435 result in a lower resistance of (P-channel) transistor 414. Advantageously, when two fixed resistors are included in series with a transistor, some of the signal voltage swing at the input is dropped across the fixed resistors. Consequently, there is less of a voltage drop across the channel of the transistor, and the resistance between input terminals is closer to the desired value (largely determined by the fixed resistors). Alternatively, if the magnitude of the input signal is limited, a single transistor may be used for the variable resistor and the two fixed resistors omitted.

The remaining ones of the plurality of individual variable resistance circuits each includes a first resistor 417.i, a transistor 418.i, and a second resistor 419.i connected in series between nodes 404 and 406, which transistor 418.i is controlled by a gate control signal conveyed on node 438.i. While three such circuits are actually depicted in the figure, their labeling (e.g., transistors 418.0, 418.1, . . . 418.N) clearly indicate that N+1 such circuits are contemplated. The contribution of each such variable resistance circuit, along with fixed resistors 430 and 431, give rise to the total resistance of the input termination resistor 412. As will become clear in the following description, in this embodiment the various gate control signals are accordingly driven to continuously keep the magnitude of the input termination resistor 412 equal to a precise ratio of an external precision resistor. Exemplary values of N are also described herebelow.

The input impedance circuit 400 includes an $I_{TUNE}$ generator 460 which includes an external resistor 462, preferably a precision resistor, having a value equal to $R_{EXT}$. A transistor 472 receives a gate bias voltage VB conveyed on node 468 and functions as a current source to cause a reference current $I_{REF}$ to flow through the external resistor 462, thus causing a reference voltage $V_{REF1}$ to be established at node 463 and communicated to the inverting input of operational amplifier 466. An internal resistor 464 is implemented having a value $R_{INT}$ preferably equal to the expected value $R_{EXT}$ of the external resistor 462, although due to process and environmental variations, they are likely to be mismatched in actuality. Alternatively, the external resistor 462 need not be implemented off-chip. It may be an on-chip resistor which is laser trimmed to achieve an accurate and repeatable value, to which the other resistors (described below) are tuned.

Any current $I_{TUNE}$ which flows through transistor 474 and internal resistor 464 produces a non-zero voltage on node 465, which is communicated to the non-inverting input of operational amplifier 466. The operational amplifier 466 adjusts its output node 467 to a suitable voltage to adjust the current $I_{TUNE}$ to produce on node 465 a voltage equal to the reference voltage $V_{REF1}$. Consequently, IREF REXT=$I_{TUNE}$ $R_{INT}$. It follows that:

$$I_{TUNE}/I_{REF}=R_{EXT}/R_{INT} \quad \text{(Eq. 1)}$$

In other words, the ratio of the two currents, $I_{TUNE}$ to $I_{REF}$, is the same as the resistor mismatch ratio, $R_{EXT}$ to $R_{INT}$.

The reference current $I_{REF}$ which flows through transistor 472 is mirrored by transistor 473 to cause a current that is proportional to the reference current to flow through transistor 473, through a replica resistor 439 of the input termination resistor 412, to node 446 (which is biased by operational amplifier 434 as described herebelow). Similarly, the current $I_{TUNE}$ which flows through transistor 474 is mirrored by transistor 475 to cause a current that is proportional to the current $I_{TUNE}$ to flow through transistor 475, through a resistor 440 preferably having a resistance $R_1$ which is equal to the desired input termination resistor value (e.g., 100 ohms), and further to node 446. The two resistors 464 and 440 are preferably carefully implemented so that the ratio $R_1/R_{INT}$ is accurately known.

The current proportional to $I_{TUNE}$ flowing through resistor 440 establishes a reference voltage $V_{REF2}$ which is communicated to the non-inverting input of amplifier circuit 442, which is preferably an operational amplifier circuit. This amplifier circuit 442 adjusts its output voltage signal $V_A$ (conveyed on node 435) accordingly to adjust the resistance of transistor 424 in a direction to achieve a voltage on node 444 (being communicated to the inverting input of operational amplifier 442) which is equal to the reference voltage $V_{REF2}$. As the output voltage signal $V_A$ increases, the resistance of transistor 424 also increases (assuming P-channel transistors as depicted in this embodiment), and consequently the resistance of the replica termination resistor 439 also increases.

If the voltage $V_A$ exceeds a predetermined high threshold level $V_{REF}H$, the output 451 of comparator 450 is driven high at the falling edge of a clock signal CLK, which asserts a decrement signal to the $R_{DIG}$ control register 454. At the next rising edge of the clock signal CLK, the $R_{DIG}$ control register 454 is decremented by one step. The various outputs of the $R_{DIG}$ control register 454 are then inverted and driven onto the appropriate gate control signals conveyed on node 438.i by a corresponding plurality of "starved" inverters 436.i, thus increasing the resistance of the digital portion of the replica termination resistor 439. Preferably, a sufficient number of individual variable resistance circuits are included within the replica termination resistor 439 (and, of course, likewise within the input termination resistor 412) so that when decremented by one step, the value of the replica termination resistor 439 increases by approximately 6.25%, although other small increases may also be chosen. In the preferred embodiment, the $R_{DIG}$ control register 454 produces a "thermometer coded" output. Seven such individual variable resistance circuits, having equal weights, will result in eight different resistance values and produce such a 6.25% increase or decrease per step. The analog control loop based on amplifier circuit 442 will then respond to this increase in resistance in the digital portion of the replica termination resistor 439 by driving the voltage of $V_A$ lower, thereby decreasing the resistance of transistor 424 to offset the increase in the resistance of the digital portion. The speed of the amplifier circuit 442 loop is preferably fast enough, relative to the clock rate of CLK and to the slew rate of the digital gate control signals 438.i, so that the $V_A$ voltage responds and is driven below the high threshold level $V_{REF}H$ before the next falling edge of the clock signal CLK. Consequently, the decrement signal on node 451 is deasserted before the next rising edge of the clock signal CLK.

Similarly, if the voltage $V_A$ falls below a predetermined low threshold level $V_{REF}L$, the output 453 of comparator 452 is driven high at the falling edge of the clock signal CLK, which asserts an increment signal to the $R_{DIG}$ control register 454. At the next rising edge of the clock signal CLK, the $R_{DIG}$ control register 454 is incremented by one step, thus decreasing the resistance of the digital portion of the replica termination resistor 439. The analog control loop based on amplifier circuit 442 will then respond to this decrease in resistance in the digital portion of the replica termination resistor 439 by driving the voltage of $V_A$ higher, thereby increasing the resistance of transistor 424 to offset the decrease in the digital portion. As before, the speed of the amplifier circuit 442 loop is preferably fast enough, relative to the clock rate of CLK and to the slew rate of the digital gate control signals 438.i, so that the $V_A$ voltage responds and is driven above the low threshold level $V_{REF}L$ before the next falling edge of the clock signal CLK. Consequently, the increment signal on node 453 is deasserted before the next rising edge of the clock signal CLK.

It is possible that the $V_A$ voltage may sufficiently exceed the high threshold level $V_{REF}H$ such that, even when the $R_{DIG}$ control register 454 is decremented once, the $V_A$ voltage remains above the high threshold level $V_{REF}H$. In such a case the $R_{DIG}$ control register 454 may be decremented during each of several consecutive clock cycles of the clock signal CLK, until the resistance of the digital portion of the replica termination resistor 439 is modulated enough to allow the $V_A$ voltage to fall below the high threshold level $V_{REF}H$. Similarly, more than one consecutive increment cycle may result when the $V_A$ voltage is well below the low threshold level $V_{REF}L$. Nonetheless, the circuit 400 eventually stabilizes at an operating point where the voltage of node 444 equals the reference voltage $V_{REF2}$, and where $V_{REF}L < V_A < V_{REF}H$. At this point the following relationship holds:

$$\alpha I_{TUNE} R_1 = \alpha I_{REF}(R_{REPLICA})$$

Consequently, it follows that:

$$I_{TUNE}/I_{REF} = (R_{REPLICA})/R_1 \quad \text{(Eq. 2)}$$

Equating (1) and (2) gives $$R_{EXT}/R_{INT} = (R_{REPLICA})/R_1$$

But since $R_1$ is a precise ratio of $R_{INT}$, (i.e., $R_1 = \beta R_{INT}$), then it follows that:

$$R_{REPLICA} = \beta R_{EXT} \quad \text{(Eq. 3)}$$

Since the input termination resistor 412 preferably matches the replica termination resistor 439, the input termination resistor 412 will have a value equal to a predetermined scaling factor times the value of the external resistor $R_{EXT}$, and moreover will have the precision of the external resistor $R_{EXT}$ (assuming that the $R_{INT}$ resistor 464 and the $R_1$ resistor 440 are well enough matched that the scaling factor $\beta$ is extremely accurately known).

It should be noted that the operational amplifier 434 drives its output node 446 to a voltage which results in node 438 of the replica termination resistor 439 having the same voltage as the common mode voltage $V_{CM}$ (i.e., node 437) of the input termination resistor 412. This common mode voltage is generated by the voltage divider circuit formed, in this example, by resistors 430 and 431. Other resistance circuits may alternatively be employed to form such a voltage divider.

After the initial startup of the input impedance circuit 400 during which the initial values of the $R_{DIG}$ control register 454 are set and the value of the $V_A$ voltage is determined, the input termination resistor 412 is preferably maintained at its desired resistance value without any sudden changes or "glitches" in its value. This is a particularly desirable characteristic of this input impedance circuit 400 which follows if the drift of resistance value is slow relative to the clock rate of the clock signal CLK (which is almost assured), and if the analog portion of the input termination resistor 412 is fast enough to compensate for changes in the digital portion of the input termination resistor 412.

In tracking a parametric drift, when the $V_A$ voltage is first driven beyond either the high threshold level $V_{REF}H$ or the low threshold level $V_{REF}L$, then the $R_{DIG}$ control register 454 will usually need to be decremented or incremented only once to bring the value of $V_A$ back near the center of its dynamic range (and between the two threshold voltages). The $R_{DIG}$ control register 454 output signals are buffered through "starved" inverters 436.i (i.e., 436.0, 436.1, . . . 436.N) to accomplish an extremely slow ramp-rate in whichever one(s) of the digital gate control signals 438.i happen to change states during an increment or decrement operation. This results in an extremely slow change in the resistance of the digital portion of the replica termination resistor 439, which affords the feedback loop based upon the amplifier circuit 442 (and to a lesser extent, operational amplifier 434) time to compensate for this change in resistance even during the (preferably slow) transition time of the digital gate control signals 438.i. In other words, the analog loop is fast enough that the total resistance value of the replica termination resistor 439 remains substantially constant even as its digital portion switches. As a result, the input termination resistor 412 value remains constant as the underlying resistor parameters drift, yet without any noticeable perturbations or transient effects which might otherwise disrupt the signal integrity of the incoming data input signal.

Other variations in such a circuit are contemplated, and several are described below. One such variation includes one or more voltage slow transition generators, such as a DAC, as described above in the context of the variable capacitance circuits, rather than using starved inverters. The weighting of the digital portion of both the input termination resistor 412 and the replica termination resistor 439, described above as a plurality of uniformly weighted variable resistance circuits may, of course, be implemented using other weighting values, including a plurality of binary-weighted variable resistance circuits responsive to a binary digital code generated by the $R_{DIG}$ control register 454. Alternatively, a combination of non-identical and identically-weighted variable resistance circuits may be employed, which can be particularly advantageous in reducing required calibration times.

Another variation utilizes analog voltage control of each of the gate control signals (i.e., nodes 438.i) to vary the resistance of the corresponding variable resistance circuit. For example, the "power supply" voltage provided to each of the final buffers for the gate control signals (e.g., analogous to inverters 436.i) may instead be a controllable analog voltage which is varied to influence the voltage level of the "driven high" gate control signals. Whenever a new digital code is generated by the $R_{DIG}$ control register 454, the analog voltage may be varied using an analog control loop to keep the total value of the replica termination resistor 439 constant (and likewise the input termination resistor 412 value constant).

In another embodiment, the external $R_{EXT}$ resistor may actually be implemented on-chip, and may be calibrated such as by laser trimming, digital control, or other methods to achieve a known resistance. One or more similar circuits to that described above may be employed to adjust each of a group of internal resistors to a precise ratio of the known resistance, rather than having to adjust each such internal resistor independently.

The above described input impedance circuit 400 illustrates one of the ways a resistor connected between two differential nodes may be sensed and adjusted. In other configurations having a more straightforward single-ended-type load resistor, particularly when connected between a power supply node (or another node having a relatively stable voltage) and an internal circuit node, various circuits useful to sense and adjust such a resistor may be easily implemented using the teachings set forth above. For example, a termination resistance circuit for a single-ended input may be accomplished by connecting node 406 and node 446 to a signal reference node, such as a signal ground node, and eliminating the common mode circuitry formed by resistors 430, 431, 432, and 433 and amplifier 434.

Figure 21:
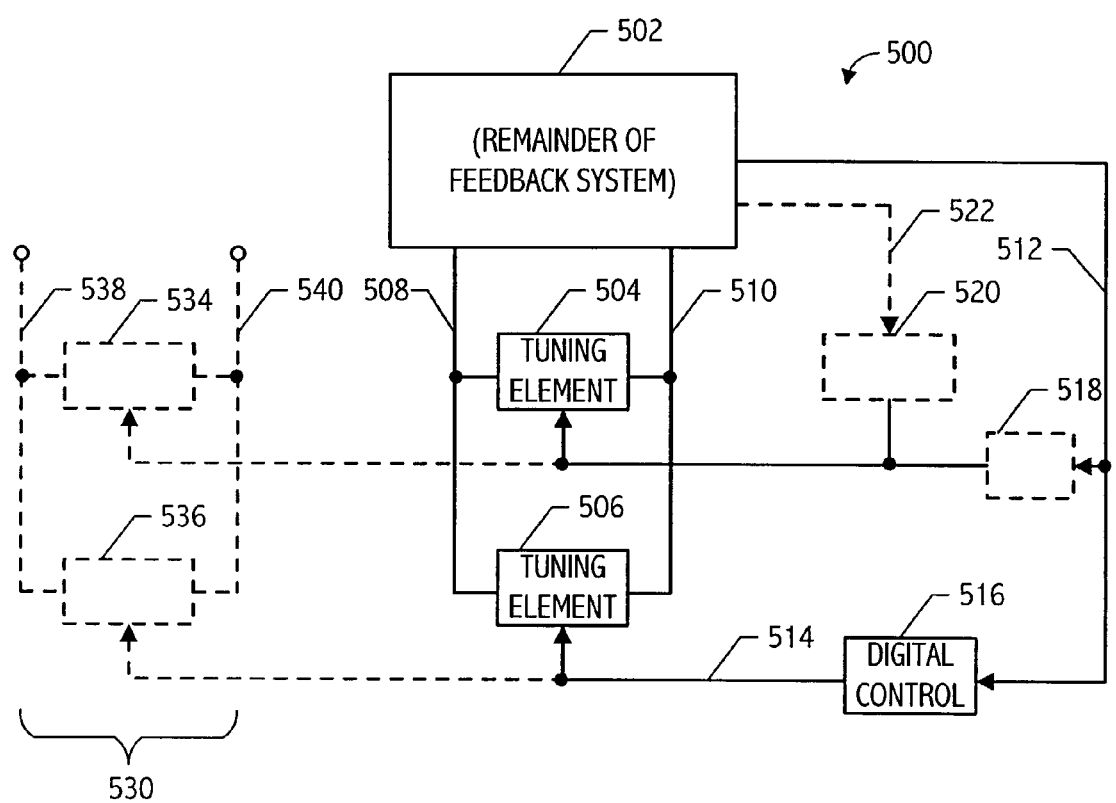
FIG. 21 is a block diagram depicting several variations of a feedback system, all in accordance with the present invention.

The feedback system just described may be generalized as shown in FIG. 21. A feedback system 500 includes a pair of tuning elements 504, 506 connected in parallel between nodes 508 and 510 which nodes are communicated to the remainder 502 of the feedback system. A first feedback loop is formed as a result of a first control signal conveyed on node 512 controlling the first tuning element 504. A digital control block 516, responsive to the first control signal conveyed on node 512, generates at least one output signal on node 514 that is coupled to control the second tuning element 576, thus forming a second feedback loop. An optional analog control block 518 may be included to generate the control signal for the tuning element 504 in response to the first control signal conveyed on node 512. In some embodiments, the same control signal conveyed on node 512 is coupled to both the digital control block 516 and to the analog control block 518 (if present), while in other embodiments the first (e.g., analog) feedback loop may respond to a separate control signal 522 and may utilize an optional analog control block 520. The feedback system 500 may include a second pair of tuning elements 534 and 536, connected in parallel between nodes 538 and 540, that are implemented to carefully match (or track with a well-controlled scaling factor) the tuning elements 504 and 506, respectively. The signal that controls the tuning element 504 is also coupled to the tracking tuning element 534 so that their behavior is well matched. Likewise, the signal(s) that controls the tuning element 506 (conveyed on node 514) is also coupled to the tracking tuning element 536 so that their behavior is also well matched. The aggregate impedance between nodes 538 and 540 is thus controlled by the feedback system 500, but the nodes 538 and 540 are themselves available to connect within another circuit. Additional circuits 530 (not shown in the figure) are also specifically contemplated, each including a pair of tuning elements analogous to tuning elements 534 and 536, and connected in parallel between a pair of circuit nodes, and which tuning elements are implemented to have a magnitude which is proportional to and carefully track the tuning elements 504 and 506, respectively. As used herein such an impedance may include a resistance, a reactance, or both.

Figure 22:
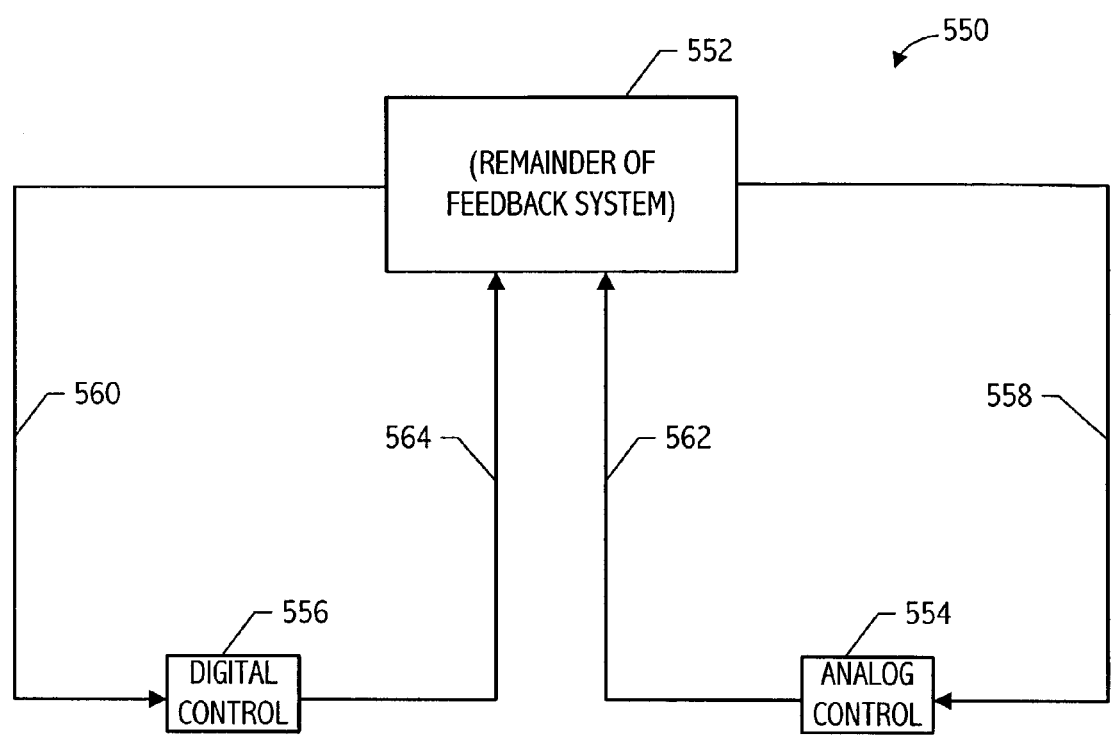
FIG. 22 is a block diagram of a feedback system in accordance with the present invention.

Utilizing the teachings thus far described, a variety of different systems may be generalized which advantageously incorporate both a (preferably slow) digital feedback loop and an analog feedback loop. In another embodiment depicted in FIG. 22, a feedback system 550 includes an analog control block 554, responsive to a first control signal conveyed on node 558, whose output is coupled to a first control input 562 of the remainder 552 of the feedback system, thus forming a first feedback loop. The feedback system 550 further includes a digital control block 556, responsive to a second control signal conveyed on node 560, whose at least one output is coupled to a second control input 564 of the remainder 552 of the feedback system, thus forming a second feedback loop.

Figure 23:
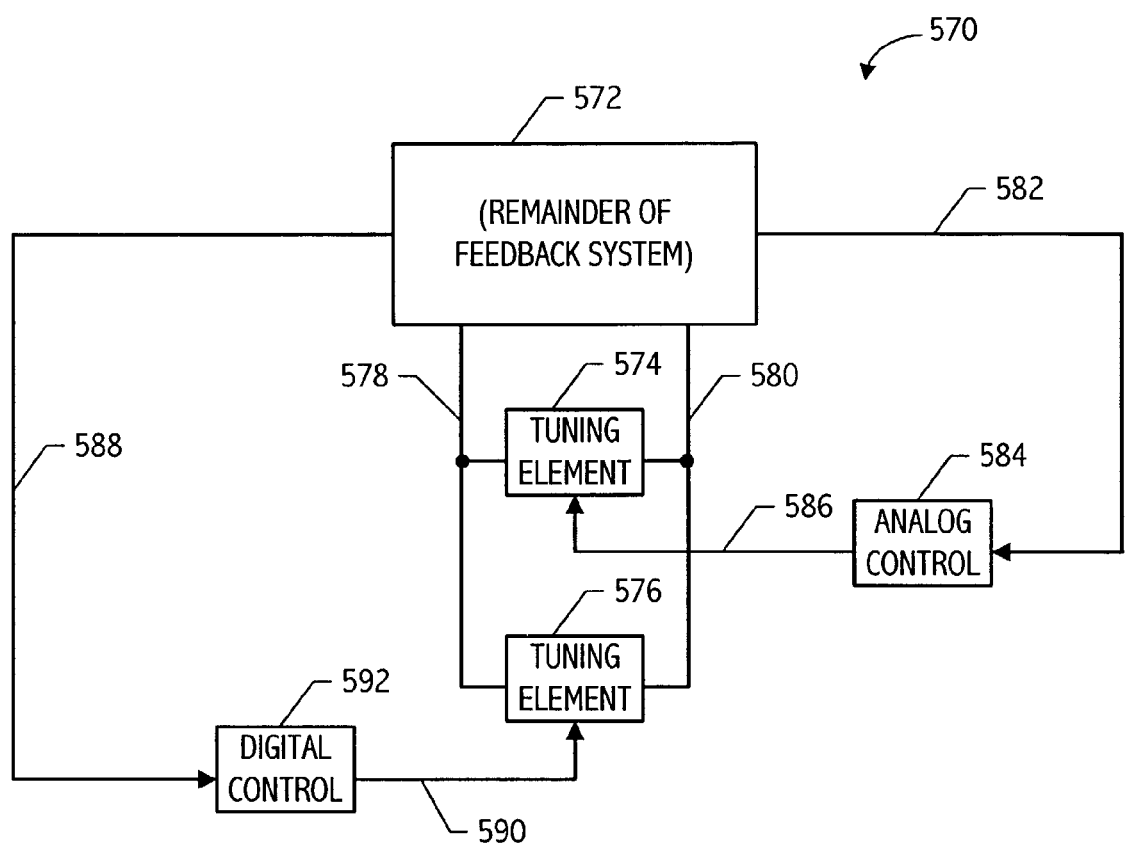
FIG. 23 is a block diagram of another feedback system in accordance with the present invention.

In another embodiment depicted in FIG. 23, a feedback system 570 includes a pair of tuning elements 574, 576 connected in parallel between nodes 578 and 580 which nodes are communicated to the remainder 572 of the feedback system. An analog control block 584 is responsive to a first control signal conveyed on node 582 and generates an output signal on node 586 for controlling the first tuning element 574, thus forming a first feedback loop. A digital control block 592, responsive to a second control signal conveyed on node 588, generates at least one output signal on node 590 that is coupled to control the second tuning element 576, thus forming a second feedback loop. In some embodiments, the first and second control signals 582 and 588 may be separate signals (as shown), while in other embodiments they may be the same or substantially the same signal.

Figure 24:
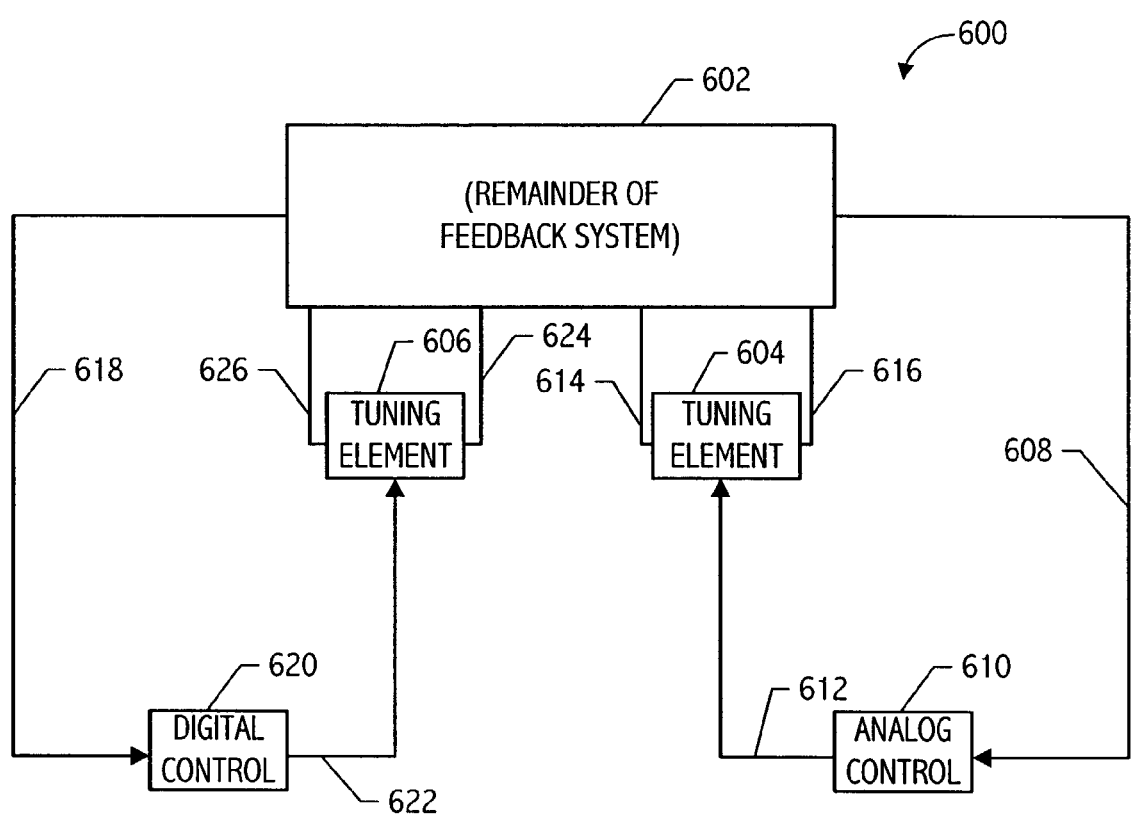
FIG. 24 is a block diagram of yet another feedback system in accordance with the present invention. The use of the same reference symbols in different drawings indicates similar or identical items.

In yet another embodiment depicted in FIG. 24, a feedback system 600 includes a first tuning element 604 connected between nodes 614 and 616, which nodes are communicated to the remainder 602 of the feedback system. A second tuning element 606 is connected between nodes 624 and 626, which nodes are also communicated to the remainder 602 of the feedback system. An analog control block 610 is responsive to a first control signal conveyed on node 608 and generates an output signal on node 612 for controlling the first tuning element 604, thus forming a first feedback loop. A digital control block 620, responsive to a second control signal conveyed on node 618, generates at least one output signal on node 622 that is coupled to control the second tuning element 606, thus forming a second feedback loop. In some embodiments, the first and second control signals 608 and 618 may be separate signals (as shown), while in other embodiments they may be the same or substantially the same signal.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Unless otherwise defined herein in the context of its usage, a significant perturbation of a parameter or condition, as used herein, is generally an amount which causes a circuit to materially behave differently. A perturbation of a parameter or condition which is large enough to result in the failure to meet a particular design specification is a significant perturbation of the parameter or condition.

Unless otherwise defined herein in the context of its usage, a first signal is related to a second signal if either is derived from the other, or if they are the same signal. Unless otherwise defined herein in the context of its usage, a capacitance circuit provides at least a capacitance between its terminals, but should not be narrowly interpreted to require a literal 'capacitor' element, although such a capacitor element is certainly contemplated. Other elements may be employed, such as transistor structures, to achieve a capacitance, and resistive components may also be present, even if only as a parasitic element. Similarly, unless otherwise defined herein in the context of its usage, a resistance circuit provides at least a resistive component of an impedance between its terminals, but should not be narrowly interpreted to require a literal 'resistor' element, although such an element is certainly contemplated. Other elements may be employed, such as transistor structures, particularly long-channel transistor structures, to achieve a resistance, and reactive components may also be present, even if only as a parasitic element. A capacitance circuit and a resistance circuit may include other structures, such as a switch circuit, as the context so requires. Unless otherwise defined herein in the context of its usage, a switch circuit may include any structure which can function as a switch, achieving a large change in resistance between its "on" state and "off" state in response to a control signal. For example, a single transistor, a full CMOS transfer gate structure, are but two examples of a wide variety of structures which may function as a switch circuit.

Unless otherwise defined herein in the context of its usage, a "nominal" value of an element, parameter, operating condition, or other aspect is generally the expected value of such element, which, if controllable by a control signal, may correspond to the mid-point or average value of the range of values, and if subject to variations resulting from semiconductor or environmental parameter variations, may correspond to the design target for a representative mid-value of the expected range. It should be understood that many such elements described as having a nominal value, may actually have, at any given time, a value that is different.

While preferred embodiments may show at most one switch control signal "slow switched" from one static level to the other static level, it should be understood that more than one such signal may be advantageously transitioned at a time, such as for a binary weighted variable capacitance circuit. It should be further understood that in the appended claims one or more switch control signals may transition between static levels at a time unless otherwise explicitly stated in the claim.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Although certain implementation techniques (e.g., logic synthesis, etc.) are not specifically described, such techniques are well known, and no particular advantage is afforded by specific variations of such techniques in the context of practicing this invention. Conventional circuit design and layout tools may be used to implement the invention. The specific embodiments described herein, and in particular the various bit widths, register sizes, signed or unsigned format of certain digital values, and operating frequencies, are illustrative of exemplary embodiments, and should not be viewed as limiting the invention to such specific implementation choices.

The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., compactflash cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL circuit and an impedance tuning circuit, the teachings of the present invention are believed advantageous for use with other types of feedback systems. Moreover, the techniques described herein may also applied to other types of circuit applications. Accordingly, other embodiments, variations, and improvements not described herein are not necessarily excluded from the scope of the invention.

What is claimed is:

1. A method of operating an electronic feedback system including a first feedback loop having at least a first control signal for controlling a first operating parameter of the feedback system, said method comprising the steps of:

allowing the first feedback loop to control the feedback system so long as the first control signal remains within a particular range of values;

determining if the first control signal is driven either in one direction outside of the particular range or in the other direction outside the particular range; and changing at least one of a group of one or more digital control signals of a second feedback loop to influence the feedback system in a manner which, absent the first feedback loop, would result in a change to the controlled first operating parameter in like direction as is cause by the control signal itself, thereby driving the first control signal back within the particular range by operation of the first feedback loop.

2. The invention as in claim 1 wherein the changing step comprises:

driving at least one of the digital control signals from a first static value to a second static value slowly enough and to consequently influence the feedback system slowly enough, relative to the first feedback loop, to allow the first feedback loop to maintain the controlled first operating parameter without significant perturbation.

3. The invention as recited in claim 1 wherein:

the electronic feedback system comprises a phase locked loop; and the controlled first operating parameter comprises a phase or phase/frequency error of the phase locked loop.

4. The invention as recited in claim 1 wherein:

the electronic feedback system comprises a phase locked loop having a controlled oscillator; and the controlled first operating parameter comprises an operating frequency of the controlled oscillator.

5. The invention as recited in claim 1 wherein:

the controlled first operating parameter comprises an effective impedance between two circuit nodes.

6. The invention as recited in claim 1 wherein:

the second feedback loop is configured to affect a larger controlled range of the controlled first operating parameter than the first feedback loop is configured to affect.

7. A phase locked loop system comprising:

a controlled oscillator for generating an output signal having a frequency responsive to at least a first control signal;

a phase detector for generating an error signal indicative of at least phase error between a first input signal and a second input signal derived from the controlled oscillator output signal;

a first feedback loop arranged to influence the first control signal in accordance with the error signal, and to consequently influence the frequency of the controlled oscillator in a direction to reduce the error signal; and a second feedback loop arranged to influence the frequency of the controlled oscillator, when the first control signal falls outside a particular range, in a like direction as that caused by the first control signal itself, thereby providing for operation of the first feedback loop to drive the first control signal to within the particular range.

8. The invention as recited in claim 7 wherein:
the phase detector error signal is indicative of phase/frequency error between the first input signal and the second input signal.

9. The invention as recited in claim 7 further comprising:
a data retiming circuit adapted for data recovery of a bit serial digital signal that is at least related to the phase detector first input signal.

10. The invention as recited in claim 9 wherein:
the bit serial digital signal comprises a SONET data signal.

11. The invention as recited in claim 7 wherein:
the second feedback loop is arranged to influence the frequency of the controlled oscillator output signal sufficiently more slowly than does the first feedback loop such that the error signal is not substantially perturbed by operation of the second feedback loop.

12. The invention as recited in claim 7 wherein:
the second feedback loop is arranged to refrain from driving the first control signal if already within the particular range.

13. The invention as recited in claim 7 wherein:
the at least a first control signal comprises a first control voltage; and
the particular range comprises a voltage range less than the voltage range of the first control voltage and which includes the mid-point of the expected voltage range of the first control voltage.

14. The invention as recited in claim 13 wherein the controlled oscillator comprises:
a first variable impedance circuit for controlling the frequency of the controlled oscillator;
a first control circuit, responsive to the first control voltage, for generating at least one control signal for the first variable impedance circuit to increase the frequency of the voltage controlled oscillator when the first control voltage is driven in a particular direction;
a second variable impedance circuit for controlling the frequency of the controlled oscillator; and
a second control circuit, responsive to a second control voltage, for generating at least one control signal for the second variable impedance to increase the frequency of the controlled oscillator when the first control voltage is driven in the particular direction;
wherein the first variable impedance circuit and the first control circuit together form a portion of the first feedback loop; and
wherein the second variable impedance circuit and the second control circuit together form a portion of the second feedback loop.

15. The invention as recited in claim 14 wherein:
the second control voltage for the second control circuit is the same as the first control voltage for the first control circuit.

16. The invention as recited in claim 14 wherein:
the second control voltage for the second control circuit is other than the first control voltage for the first control circuit.

17. The invention as recited in claim 14 wherein:
the first variable impedance circuit is coupled between a first pair of nodes of the controlled oscillator; and
the second variable impedance circuit is also coupled between the first pair of nodes of the controlled oscillator.

18. The invention as recited in claim 14 wherein the second variable impedance circuit comprises:
a plurality of impedance circuits, each respectively coupled in series with a respective switch circuit, together coupled in parallel; and
a switch drive circuit for providing on a respective output coupled to each respective switch circuit a respective switch control signal having two static voltage levels and having, when transitioning from one to the other of the two static voltage levels, a controlled deliberately slow rise time and fall time.

19. The invention as recited in claim 18 wherein the switch drive circuit comprises:
a digital control circuit having a first plurality of output buffers for providing a respective first plurality of digital switch control signals, wherein each of the output buffers is sized, relative to its output capacitive loading, to provide a controlled slow transition time between the two static voltage levels.

20. The invention as recited in claim 18 wherein the switch drive circuit is arranged so that, at most, only one of the switch control signals is transitioned between the two static voltage levels at any time.

21. The invention as recited in claim 18 wherein switch drive circuit further comprises:
comparison circuitry for generating at least one out-of-range (OOR) signal when the first control signal is driven outside the particular range;
a digital control circuit responsive to the at least one OOR signal for increasing or decreasing the number of switch control signals which are driven to an active level.

22. The invention as recited in claim 18 further comprising:
a data retiming circuit adapted for data recovery of a bit serial digital signal operating at a data rate, being responsive to a first signal related to the phase detector first input signal, and further responsive to a second signal derived from the voltage controlled oscillator output signal; and
wherein the controlled slow rise time and fall times are varied in accordance with the data rate of the bit serial data signal.

23. The invention as recited in claim 18 wherein the switch drive circuit comprises:
a digital control circuit having a first plurality of output buffers for providing a first plurality of digital output signals, each digital output signal having first and second static voltage levels;
at least one controlled rise and fall time circuit for generating an output signal having two static voltage levels substantially equal to the first and second static voltage levels, respectively, and having, when transitioning from one to the other of the two static voltage levels, a controlled slow rise time and fall time;
a plurality of multiplexer circuits, each for coupling a respective switch control signal output to either a corresponding output of the digital control circuit or to the output of the controlled rise and fall time circuit.

24. The invention as in claim 23 wherein the at least one controlled rise and fall time circuit comprises a starved inverter circuit.

25. The invention as in claim 23 wherein the at least one controlled rise and fall time circuit comprises:
  a digital-to-analog converter circuit responsive to a plurality of digital signals forming a digital word; and
  a control circuit for generating the plurality of digital signals forming the digital word, and for controlling the digital word to sequentially change from an initial digital value to a final digital value at a controlled rate, thereby producing a controlled rise time and fall time at the output of the digital-to-analog converter circuit.

26. A circuit for providing a variable effective impedance between a pair of circuit nodes which is responsive to a first control signal, said circuit comprising:
  at least one variable impedance circuit coupled between the pair of circuit nodes, having a respective value of its impedance that is responsive to a control signal derived from or identical to the first control signal;
  a plurality of variable impedance circuits coupled in parallel between the pair of circuit nodes, each having a respective value of its impedance that is responsive to a respective one of a plurality of digital control signals coupled thereto; and
  a first control circuit responsive to at least one input signal for generating each of the plurality of digital control signals, each control signal having two static signal levels and having a controlled slow transition time when transitioning from one to the other of the two static signal levels.

27. The invention as recited in claim 26 wherein the at least one impedance circuit comprises a resistance circuit.

28. The invention as recited in claim 26 wherein the at least one impedance circuit comprises a capacitance circuit.

29. The invention as recited in claim 26 wherein the first control circuit comprises:
  a plurality of output buffers for providing the plurality of digital control signals, each digital control signal having two static voltage levels, wherein each of the output buffers is sized, relative to its output capacitive loading, to provide a controlled slow transition time between the two static voltage levels.

30. The invention as recited in claim 26 wherein the first control circuit comprises:
  a digital control circuit having a first plurality of output buffers for providing a first plurality of digital output signals, each digital output signal having first and second static voltage levels;
  a controlled rise and fall time circuit for generating an output signal having two static voltage levels substantially equal to the first and second static voltage levels, respectively, and having, when transitioning from one to the other of the two static voltage levels, a controlled rise time and fall time;
  a plurality of multiplexer circuits, each for coupling a respective digital control signal output to either a corresponding output of the digital control circuit or to the output of the controlled rise and fall time circuit.

31. The invention as in claim 26 further comprising:
  an oscillator circuit coupled to the variable impedance circuit to form a voltage controlled oscillator circuit.

32. The invention as recited in claim 26 wherein the first control circuit is arranged so that, at most, only one of the digital control signals is transitioned between the two static signal levels at any time.

33. The invention as in claim 32 wherein the controlled slow transition time between the two static voltage levels is variable in accordance with at least one operating condition of the circuit.

34. The invention as recited in claim 26 wherein:
  each of the plurality of variable impedance circuits comprises at least one impedance circuit in series with an associated transistor, together connected between the pair of circuit nodes, wherein a control terminal of each respective transistor is coupled to receive a respective digital control signal from the control circuit.

35. The invention as recited in claim 34 wherein the first control circuit comprises:
  at least one controlled rise and fall time circuit for conveying, on at least some of the plurality of digital control signals, a control voltage having two static voltage levels and having, when transitioning from one to the other of the two static voltage levels, a controlled rise time and fall time.

36. The invention as recited in claim 35 wherein the at least one controlled rise and fall time circuit comprises:
  a digital circuit having a starved output driver.

37. The invention as recited in claim 35 wherein the at least one controlled rise and fall time circuit comprises:
  a digital-to-analog converter circuit responsive to a second plurality of digital signals forming a digital word; and
  a second control circuit for generating the second plurality of digital signals forming the digital word, and for controlling the digital word to sequentially change from an initial digital value to a final digital value at a controlled rate, thereby producing a controlled rise time and fall time at the output of the digital-to-analog converter circuit.

38. The invention as recited in claim 37 wherein the digital word includes at least 4 bits.

39. A computer readable medium encoding a phase locked loop circuit, said encoded circuit comprising:
  a controlled oscillator for generating an output signal having a frequency responsive at least to a first control signal;
  a phase detector for generating an error signal indicative of at least phase error between a first input signal and a second input signal derived from the controlled oscillator output signal;
  a first feedback loop arranged to influence the at least a first control signal in accordance with the error signal, and to consequently influence the frequency of the controlled oscillator in a direction to reduce the error signal; and
  a second feedback loop arranged to influence the frequency of the controlled oscillator, when the at least a first control signal falls outside a particular range, in a like direction as that caused by the at least a first control signal itself, thereby providing for operation of the first feedback loop to drive the at least a first control signal to within the particular range.

40. The invention as recited in claim 39 wherein the encoded circuit further comprises:
  a data retiming circuit adapted for data recovery of a bit serial digital signal that is at least related to the phase detector first input signal.

41. The invention as recited in claim 40 wherein the encoded circuit is adapted to recover a SONET bit serial digital signal.

42. A computer readable medium encoding a circuit for providing a variable effective impedance between a pair of circuit nodes which is responsive to a first control signal, said encoded circuit comprising:

- at least one variable impedance circuit coupled between the pair of circuit nodes, having a respective value of its impedance that is responsive to a control signal derived from or identical to the first control signal;
- a plurality of variable impedance circuits coupled in parallel between the pair of circuit nodes, each having a respective value of its impedance that is responsive to a respective one of a plurality of digital control signals coupled thereto; and
- a first control circuit responsive to at least one input signal for generating each of the plurality of digital control signals, each control signal having two static signal levels and having a controlled slow transition time when transitioning from one to the other of the two static signal levels.

43. The invention as in claim 42 wherein the encoded circuit further comprises:

- an oscillator circuit coupled to the variable impedance circuit to form a voltage controlled oscillator circuit.

44. The invention as recited in claim 42 wherein the first control circuit comprises:

- a digital control circuit having a first plurality of output buffers for providing a first plurality of digital output signals, each digital output signal having first and second static voltage levels;
- a controlled rise and fall time circuit for generating an output signal having two static voltage levels substantially equal to the first and second static voltage levels, respectively, and having, when transitioning from one to the other of the two static voltage levels, a controlled rise time and fall time;
- a plurality of multiplexer circuits, each for coupling a respective digital control signal output to either a corresponding output of the digital control circuit or to the output of the controlled rise and fall time circuit.

45. The invention as in claim 44 wherein the encoded circuit controlled slow transition time between the two static voltage levels is variable in accordance with at least one operating condition of the circuit.

46. In a circuit having a feedback loop including an analog control signal for adjusting a variable impedance circuit between a first node and a second node, said variable impedance circuit having an analog portion responsive in magnitude to the analog control signal and having a digital portion responsive in magnitude to a plurality of digital control signals, a method of operating the circuit comprising the steps of:

- monitoring the analog control signal to determine when its value is driven outside a particular range by the feedback loop;
- when the analog control signal is driven outside the particular range, driving at least one digital control signal with a controlled slow transition time between two static signal levels to adjust the digital portion of the variable impedance circuit to a larger or smaller value, as appropriate, so that the feedback loop drives the analog control signal back within the particular range and to adjust the analog portion to a smaller or larger value, as appropriate, to thereby maintain the magnitude of the variable impedance circuit and yet generally maintain the analog control signal within the particular range.

47. The invention as in claim 46 wherein the variable impedance circuit is incorporated within a voltage controlled oscillator (VCO) to provide varactor control of its frequency.

48. The invention as in claim 47 wherein the VCO is incorporated within a phase locked loop (PLL) configured for clock and data recovery of a bit serial digital data signal.

49. The invention as in claim 46 wherein the PLL is configured to recover SONET encoded bit serial digital data signals.

* * * * *